(12) United States Patent
Hatakeyama et al.

(10) Patent No.: US 6,994,946 B2
(45) Date of Patent: Feb. 7, 2006

(54) SILICON-CONTAINING POLYMER, RESIST COMPOSITION AND PATTERNING PROCESS

(75) Inventors: Jun Hatakeyama, Niigata-ken (JP); Takanobu Takeda, Niigata-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 53 days.

(21) Appl. No.: 10/853,783

(22) Filed: May 26, 2004

(65) Prior Publication Data

US 2004/0242821 A1 Dec. 2, 2004

(30) Foreign Application Priority Data

May 27, 2003 (JP) ........................ 2003-148656

(51) Int. Cl.
  *G03C 1/73* (2006.01)
  *G03F 7/039* (2006.01)
  *G03F 7/30* (2006.01)
  *G03F 7/36* (2006.01)
  *C08F 30/08* (2006.01)

(52) U.S. Cl. .................. 430/270.1; 430/326; 430/325; 430/327; 430/328; 430/330; 430/331; 430/313; 430/317; 430/905; 430/907; 430/908; 430/909; 430/910; 430/914; 430/942; 526/266; 526/279

(58) Field of Classification Search ................ 526/266, 526/279; 430/270.1, 905, 907, 908, 914, 430/325, 326, 330, 327, 328, 331, 942, 313, 430/317, 909, 910

See application file for complete search history.

(56) References Cited

U.S. PATENT DOCUMENTS

| | | | |
|---|---|---|---|
| 4,491,628 A | 1/1985 | Ito et al. | ...................... 430/176 |
| 5,310,619 A | 5/1994 | Crivello et al. | ........... 430/270.1 |
| 2002/0168581 A1 | 11/2002 | Hatakeyama et al. | ..... 430/270.1 |
| 2004/0006191 A1 | 1/2004 | Hatakeyama et al. | .......... 528/25 |
| 2004/0013980 A1 * | 1/2004 | Hatakeyama et al. | ........ 430/311 |

FOREIGN PATENT DOCUMENTS

| | | |
|---|---|---|
| JP | 63-27829 A | 2/1988 |
| JP | 2-27660 B2 | 6/1990 |
| JP | 5-158239 A | 6/1993 |
| JP | 5-232706 A | 9/1993 |
| JP | 5-249662 A | 9/1993 |
| JP | 5-249683 A | 9/1993 |
| JP | 5-257282 A | 10/1993 |
| JP | 5-289322 A | 11/1993 |
| JP | 5-289340 A | 11/1993 |
| JP | 2-118651 A | 4/1994 |
| JP | 9-110938 A | 4/1997 |
| JP | 10-324748 A | 12/1998 |
| JP | 11-302382 A | 11/1999 |
| JP | 2001-158808 A | 6/2001 |
| JP | 2001-278918 A | 10/2001 |
| JP | 2001-305737 A | 11/2001 |
| JP | 2002-55456 A | 2/2002 |
| JP | 2002-192866 A | 7/2002 |
| JP | 2002-256033 A | 9/2002 |
| JP | 2002-348332 A | 12/2002 |
| JP | 2004-35671 A | 2/2004 |

OTHER PUBLICATIONS

Brunsvold et al., "Evaluation of a deep UV bilayer resist for sub–half micron lithography", SPIE, vol. 1925, 1993, 377–387.

(Continued)

*Primary Examiner*—Sin J. Lee
(74) *Attorney, Agent, or Firm*—Birch, Stewart, Kolasch & Birch

(57) ABSTRACT

Novel silicon-containing polymers are provided comprising recurring units having a POSS pendant and units which improve alkali solubility under the action of an acid. Resist compositions comprising the polymers are sensitive to high-energy radiation and have a high sensitivity and resolution at a wavelength of up to 300 nm and improved resistance to oxygen plasma etching.

11 Claims, 2 Drawing Sheets

OTHER PUBLICATIONS

Hatakeyama et al., "Investigation of discrimination enhancement in polysilsesquioxane based positive resist for ArF lithography", SPIE, vol. 3333, 1998, 62–72.

Schaedeli et al., "Evaluation of materials for 193–nm lithography", Journal of Photopolymer Science and Technology, vol. 9, No. 3, 1996, 435–446.

Kessel et al., "Novel silicon–containing resists for EUV and 193 nm lithography", SPIE, vol. 3678, 1999, 214–220.

Lin et al., "A high resolution 248 nm bilayer resist", SPIE, vol. 3678, 1999, 241–250.

Boardman et al., "Chemical aspects of silicon–containing bilayer resists", SPIE, vol. 3678, 1999, 562–572.

Kim et al., "Chemically amplified resist based on the methacrylate polymer with 2–trimethylsilyl–2–propyl ester protecting group", SPIE, vol. 3678, 1999, 420–428.

Watanabe et al., "Oxygen reactive ion etching of organosilicon polymers", J. Vac. Sci Technol., B4, 1986, 422–425.

Takenaka et al., "Polymerization of monomers containing functional silyl groups", *Macromolecules*, 20, 1987, 2034–2035.

Takenaka et al., "Polymerization of monomers containing functional silyl groups", *Macromolecules*, 22, 1989, 1563–1567.

McKean et al., "A highly etch resistant, negative resist for deep–UV and electron beam lithography", SPIE, vol. 1262, 1990, 110–118.

Sebald et al., "Application aspects of the Si–CARL bilayer process", SPIE, vol. 1466, 1991, 227–237.

Gozdz et al., "Synthesis and lithographic evaluation of alternating copolymers of linear and cyclic alkenyl (di) silanes with sulfur dioxide", SPIE, vol. 1466, 1991, 520–527.

Hatakeyama et al., "Newly developed alternating–copolymer–based silicon containing resists for sub–100nm pattern fabrication", SPIE, vol. 5093, 2003, 672–681.

Lee et al., "Viscoelastic responses of polyhedral oligosilsesquioxane reinforced epoxy systems", Macromolecules, 31, 1998, 4970–4974.

Gonsalves et al., "High resolution resists for next gerneration lithography: the nanocomposite approach", Mat. Res. Soc. Symp. Proc, vol. 636, 2001, D6.5.1.

Tegou et al., "Polyhedral oligomeric silsesquioxane (POSS) based resist material for 157 nm lithography", SPIE, vol. 5039, 2003, 453–461.

English abstract of JP–A–2002–192947.

* cited by examiner

SILICON-CONTAINING POLYMER, RESIST COMPOSITION AND PATTERNING PROCESS

This Non-provisional application claims priority under 35 U.S.C. § 119(a) on Patent Application No(s). 2003-148656 filed in Japan on May 27, 2003, the entire contents of which are hereby incorporated by reference.

This invention relates to silicon-containing polymers suitable as the base resin in resist compositions, especially chemically amplified positive resist compositions used for micropatterning in a process for the fabrication of semiconductor devices. It also relates to resist compositions, especially chemically amplified positive resist compositions adapted for exposure to high-energy radiation such as deep-UV, KrF excimer laser light (248 nm), ArF excimer laser light (193 nm), $F_2$ laser light (157 nm), electron beams or x-rays, and a process for forming a pattern.

BACKGROUND OF THE INVENTION

In the drive for higher integration and operating speeds in. LSI devices, the pattern rule is made drastically finer. The rapid advance toward finer pattern rules is grounded on the development of a projection lens with an increased NA, a resist material with improved performance, and exposure light of a shorter wavelength. In particular, the change-over from i-line (365 nm) to shorter wavelength KrF excimer laser (248 nm) brought about a significant innovation, enabling mass-scale production of 0.18 micron rule devices. To the demand for a resist material with a higher resolution and sensitivity, acid-catalyzed chemical amplification positive working resist materials are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

As is known in the art, the bilayer resist method is advantageous in forming a high-aspect ratio pattern on a stepped substrate. It is also known that in order that a bilayer resist film be developable with a common alkaline developer, high molecular weight silicone compounds having hydrophilic groups such as hydroxyl and carboxyl groups must be used.

Among silicone base chemically amplified positive resist compositions, recently proposed were those compositions for KrF excimer laser exposure comprising a base resin in the form of polyhydroxybenzylsilsesquioxane, which is a stable alkali-soluble silicone polymer, in which some phenolic hydroxyl groups are blocked with t-BOC groups, in combination with a photoacid generator (see JP-A 6-118651 and SPIE vol. 1925 (1993), p. 377). Positive resist compositions comprising as a base a silsesquioxane of the type in which cyclohexylcarboxylic acid is substituted with an acid labile group were proposed for ArF excimer laser exposure (see JP-A 10-324748, JP-A 11-302382, and SPIE vol. 3333 (1998), p. 62). A positive resist composition comprising as a base resin a silsesquioxane having hexafluoroisopropanol as a solubilizing group was proposed for $F_2$ laser exposure (see JP-A 2002-55456). This polymer bears in its backbone a polysilsesquioxane containing a ladder skeleton obtained through polycondensation of a trialkoxysilane or trihalosilane. Also proposed as a resist base polymer having silicon pendants on side chains were silicon-containing (meth) acrylic ester polymers (see JP-A 9-110938, and J. Photopolymer Sci. and Technol., Vol. 9, No. 3 (1996), p. 435).

The silicon-containing polymers of (meth)acrylic ester type have the drawback that their resistance to dry etching with oxygen plasma is weak as compared with the silsesquioxane polymers. A low silicon content and a different polymer main skeleton account for this weak dry etching resistance. The siloxane pendant type (meth)acrylic ester polymer has the other drawback of poor developer wetting that it is likely to repel a liquid developer. SPIE vol. 3678 (1999), pp. 214, 241 and 562 describes a polymer of the trisilane or tetrasilane pendant type which is improved in alkali solubility by increasing a silicon content and endowing a silicon-containing group with an ability to be eliminated with acid. Although this polymer exhibits strong absorption at a wavelength of less than 200 nm on account of silicon-to-silicon bonds, it is fully highly transparent to radiation of 248 nm from a KrF excimer laser and used as a silicon-containing, acid-eliminatable group having improved etching resistance. Studies have been made on silicon-containing acid labile groups other than the foregoing (see SPIE vol. 3678 (1999), p. 420. The inventors proposed acid labile groups having silicon introduced therein (see JP-A 2001-278918 and JP-A 2001-158808). These polymers have the advantages of an improved acid elimination ability and prevention of T-top profiling and are characterized by a fully high transparency at the wavelength of an ArF excimer laser because carbon atoms intervene between silicon atoms to exclude silicon-to-silicon bonds.

We then presumed that the above-discussed problem can be solved by a resist composition comprising a polymer obtained by polymerizing a monomer having silicon attached to an unsaturated bond for polymerization, rather than the ester pendant.

For monomers having silicon attached to an unsaturated bond such as vinylsilane, neither radical polymerization of the monomer alone nor copolymerization of the monomer with norbornene or acrylic monomers is possible. They are copolymerized with hydroxystyrene by anionic polymerization. See J. Vac. Sci. Technol. B, 1986, 4, 422. Also silanes having a conjugated double bond are polymerized in the presence of living anion catalysts. See Macromolecules, 20, 2034–2035 (1987) and Macromolecules, 22, 1563–1567 (1989).

The copolymerization of allylsilane with maleimide is reported in Proc. SPIE, Vol. 1262, p. 110 (1990), and the copolymerization thereof with maleic anhydride reported in Proc. SPIE, Vol. 1466, P. 227 (1991). Allylsilane and maleimide form alternating copolymers. It is well known that vinylsilane and allylsilane copolymerize with sulfur dioxide as described in Proc. SPIE Vol. 1466, p 520 (1991). However, sulfur dioxide polymers are characterized by ease of cleavage upon exposure to light or plasma or electron beams. A phenomenon that lines were narrowed by electron beam irradiation during SEM observation was observed. It was also found that the sulfur dioxide polymers were less resistant to etching.

The inventors proposed in Proc. SPIE Vol. 5039 (2003), Proceeding No. 75, and JP-A 2002-348332, a polymer of a vinylsilane derivative, maleic anhydride, and a (meth) acrylic acid ester, having acid labile groups incorporated therein; in Japanese Patent Application No. 2002-192947, a polymer of a vinylsilane derivative, maleic anhydride, and norbornene carboxylate, having acid labile groups incorporated therein; and in Japanese Patent Application No. 2002-192866, a polymer of a vinylsilane derivative, maleic anhydride, and itaconic acid, having acid labile groups incorporated therein. The vinylsilane polymers, in which silicon atoms are directly bonded to the backbone, have a high Tg, high resistance to etching with oxygen gas, and high resistance to electron beam irradiation during SEM observation.

Bilayer resists having as a pendant a methacrylate having polyhedral oligometric silsesquioxane (POSS) as a pendant have been reported. The POSS has a cage-like structure. Its synthesis and cure properties thereof having an epoxy pendant are described in Macromolecules, Vol. 31, No. 15, p. 4970 (1998). The behavior of POSS-pendant methacrylic polymer when patterned with electron beams is described in Mater. Res. Soc. Symp., Vol. 636, D6.5.1 (2001).

JP-A 2001-305737 discloses that hexafluoropentyl alcohol-pendant POSS having acid labile groups substituted thereon is exposed to radiation of 157 nm. Proc. SPIE, Vol. 5039 (2003), Proceeding No. 49 shows the exposure properties at 157 nm of POSS pendant alpha-$CF_3$ methacrylic polymer. It has been problematic that silicon methacrylic esters are prone to generation of silicon-containing outgases upon exposure at 157 nm, the silicon-containing material deposits on the surface of a projection lens to reduce its transmittance, and such deposits cannot be removed even by $O_2$ cleaning. It was believed that only ladder polymers having a silsesquioxane skeleton in the backbone eliminate the generation of silicon-containing outgases. It was found that introduction of silsesquioxane into methacrylic polymers as a pendant eliminates the outgassing. The inventors also proposed an allyl POSS polymer in JP-A 2002-256033.

SUMMARY OF THE INVENTION

An object of the invention is to provide a novel silicon-containing polymer which is useful as the base polymer in a resist composition, especially a chemically amplified positive resist composition, having a high sensitivity and high resolution, especially suitable as a material for use in the bilayer resist method adapted to form a high-aspect ratio pattern, and capable of forming a pattern having improved heat resistance. Another object of the invention is to provide a resist composition, especially a chemically amplified positive resist composition, comprising the polymer as the base resin, and a process for forming a resist pattern using the same.

We have found that a polymer bearing silicon-containing substituent groups represented by the general formula (1), shown below, has an increased silicon content, reduces the generation of silicon-containing gases upon exposure, and is so hydrophilic as to prevent the resist from becoming repellent to a liquid developer or prevent swelling during development, thus preventing a pattern from being collapsed.

Accordingly, the present invention provides silicon-containing polymers, resist compositions and a patterning process, as defined below.

In a first aspect, the invention provides a silicon-containing polymer comprising recurring units of the general formula (1) and units which improve alkali solubility under the action of an acid.

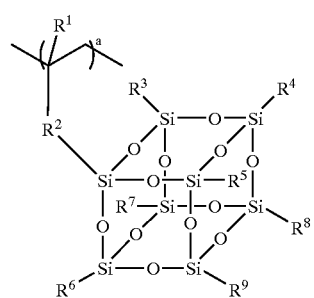

Herein $R^1$ is hydrogen or a straight, branched or cyclic $C_1$–$C_{10}$ alkyl group; $R^2$ is a single bond or a divalent linking group of the general formula (2).

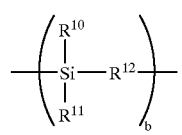

$R^3$ to $R^9$ are each independently hydrogen or a straight, branched or cyclic $C_1$–$C_{12}$ alkyl or fluoroalkyl group which may contain an ether, lactone, ester, hydroxy or cyano group; $R^{10}$ and $R^{11}$ are each independently a straight, branched or cyclic $C_1$–$C_{10}$ alkyl group; $R^{12}$ is a single bond, oxygen atom or $C_1$–$C_4$ alkylene group; "a" is a positive number, and "b" is an integer of 1 to 20.

A preferred embodiment is directed to a silicon-containing polymer comprising recurring units of the general formula (3).

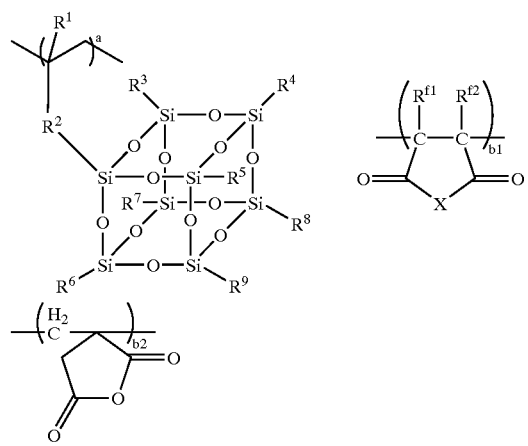

Herein $R^1$ to $R^9$ and a are as defined above; X is an oxygen atom, sulfur atom or —$NR^{13}$— wherein $R^{13}$ is hydrogen, a hydroxy group or a straight, branched or cyclic $C_1$–$C_{10}$ alkyl group, and may contain an acid labile group-substituted alkoxycarbonyl group; $R^{f1}$ and $R^{f2}$ each are hydrogen, fluorine or trifluoromethyl; b1 and b2 are 0 or positive numbers, and the sum of b1+b2 is a positive number. The sum of a+b1+b2 may be either 100 mol % of the total of entire recurring units or less than 100 mol %, with the balance being other recurring units.

Another preferred embodiment is directed to a silicon-containing polymer comprising recurring units resulting from copolymerization represented by the general formula (4).

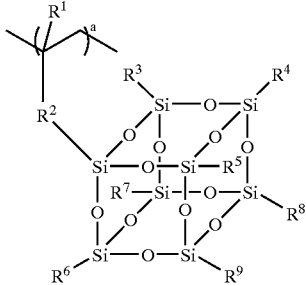
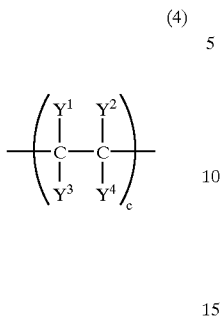

(4)

Herein $R^1$ to $R^9$ and a are as defined above; $Y^1$, $Y^2$, $Y^3$ and $Y^4$ are each independently a hydrogen atom, fluorine atom, chlorine atom, bromine atom, cyano group, alkoxycarbonyl group, fluoroalkyl group, alkoxy group, hydroxy group, acetyl group, sulfonic acid ester or sulfone, with the proviso that all of $Y^1$ to $Y^4$ are not hydrogen at the same time; and a and c are positive numbers. The sum of a+c may be either 100 mol % of the total of entire recurring units or less than 100 mol %, with the balance being other recurring units.

In addition to the recurring units "a", "b1", "b2" and "c" in the general formulae (1), (3) and (4), the polymers may further comprise acid labile group-containing recurring units selected from the general formulae (d1) to (d7). These polymers contain the recurring units "a", "b1", "b2", "c" and "d" in a total amount of 10 to 100 mol %.

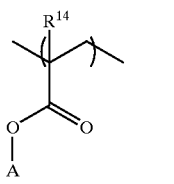

(d1)

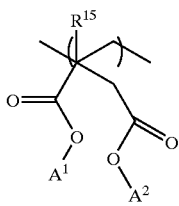

(d2)

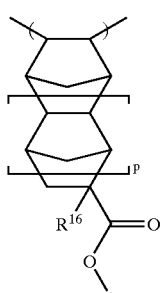

(d3)

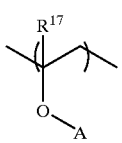

(d4)

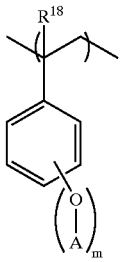

(d5)

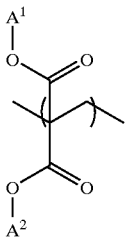

(d6)

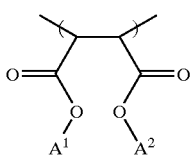

(d7)

Herein $R^{14}$ to $R^{18}$ are each independently hydrogen, a $C_1$–$C_{20}$ alkyl group, $C_6$–$C_{20}$ aryl group, $C_1$–$C_{20}$ haloalkyl group or cyano group; "A" is an acid labile group; p is 0 or 1; m is 1 or 2; both or either one of $A^1$ and $A^2$ is an acid labile group, and one of $A^1$ and $A^2$ is hydrogen, a $C_1$–$C_{20}$ alkyl group or adhesive group when it is not an acid labile group.

In a second aspect, the invention provides a resist composition comprising the polymer of any one of the foregoing embodiments.

More specifically, the invention provides a chemically amplified, positive resist composition comprising (I) the polymer defined above as a base resin, (II) a photoacid generator, and (III) an organic solvent; or a chemically amplified, positive resist composition comprising (I) the polymer defined above as a base resin, (II) a photoacid generator, (III) an organic solvent, and (IV) a dissolution inhibitor. The resist composition may further include a basic compound.

In a third aspect, the invention provides a process for forming a resist pattern comprising the steps of (1) applying the resist composition defined above onto a substrate to form a coating, (2) heat treating the coating and then exposing it to high-energy radiation having a wavelength of up to 300 nm or electron beam through a photomask, and (3) optionally heat treating the exposed coating and developing it with a developer. In one preferred embodiment wherein the substrate bears thereon an underlay on which the coating of the resist composition is formed, the process further involves the step of treating the underlay by oxygen plasma etching, after the resist pattern formation. In another preferred embodiment wherein the substrate bears thereon an underlay on which the coating of the resist composition is formed, the process further involves the step of treating the underlay by etching with a halogen gas containing chlorine or bromine, after the resist pattern formation.

It is noted that the polymers or high molecular weight compounds of the invention, especially of the general formula (4), have a high transparency and resistance to irradiation in the deep UV and vacuum UV regions, and can also be applied in areas other than the photoresist, for example, as polymers for pellicle membranes.

As used herein, the term "$C_1$–$C_{20}$" group, for example, means that the group contains 1 to 20 carbon atoms.

DESCRIPTION OF THE PREFERRED EMBODIMENTS

Polymer

Figure 1A:
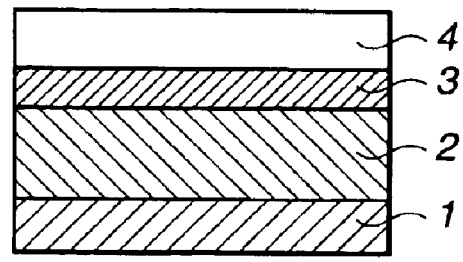
FIG. 1 schematically illustrates a patterning process involving oxygen etching.

The silicon-containing polymer or high-molecular-weight compound of the invention comprises recurring units of the general formula (1) and units which improve alkali solubility under the action of an acid. Preferred are silicon-containing polymers comprising recurring units of the general formula (3), especially formula (4). A further preferred embodiment is a silicon-containing polymer comprising recurring units of formula (5) including units "a", "b1" and/or "b2" and "c".

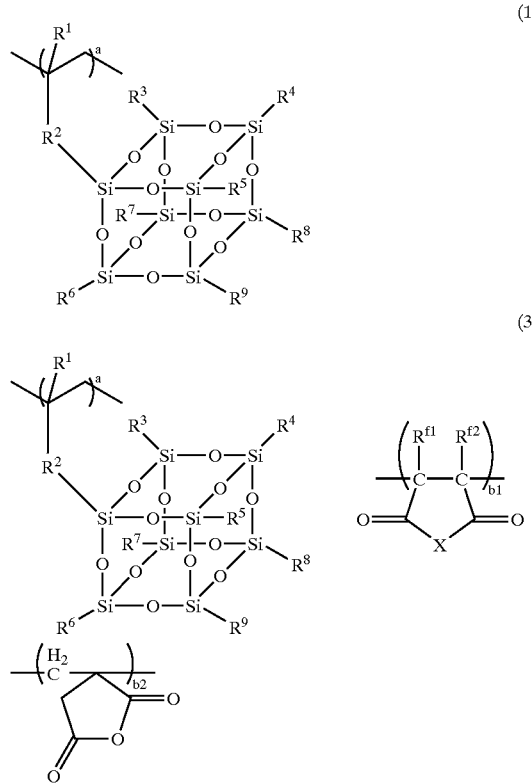

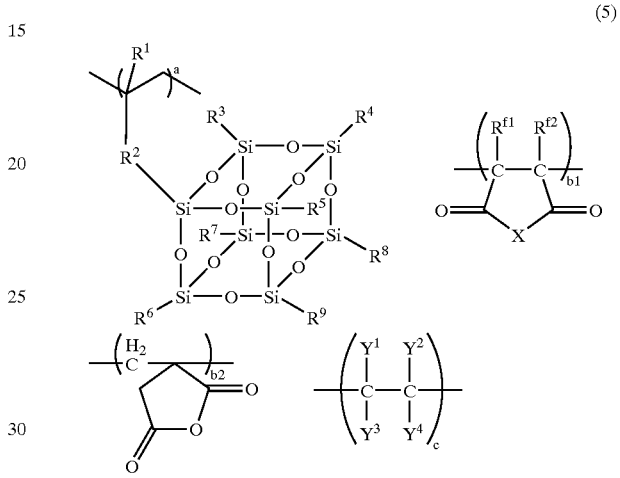

Herein, $R^1$ is hydrogen or a straight, branched or cyclic $C_1$–$C_{10}$ alkyl group. $R^2$ is a single bond or a divalent linking group of the general formula (2).

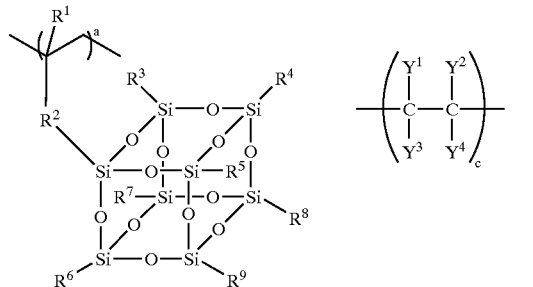

$R^3$ to $R^9$ are each independently hydrogen or a straight, branched or cyclic $C_1$–$C_{12}$ alkyl or fluoroalkyl group which may contain an ether, lactone, ester, hydroxy or cyano group. $R^{10}$ and $R^{11}$ are each independently a straight, branched or cyclic $C_1$–$C_{10}$ alkyl group. $R^{12}$ is a single bond, oxygen atom or $C_1$–$C_4$ alkylene group. The subscript "a" is a positive number, and "b" is an integer of 1 to 20. X is an oxygen atom, sulfur atom or —$NR^{13}$— wherein $R^{13}$ is hydrogen, a hydroxy group or a straight, branched or cyclic $C_1$–$C_{10}$ alkyl group, and may contain an acid labile group-substituted alkoxycarbonyl group. $R^{f1}$ and $R^{f2}$ each are hydrogen, fluorine or trifluoromethyl. The subscripts b1 and b2 are 0 or positive numbers, and the sum of b1+b2 is a positive number. The sum of a+b1+b2 may be either 100 mol % of the total of entire recurring units or less than 100 mol %, with the balance being other recurring units. $Y^1$, $Y^2$, $Y^3$ and $Y^4$ are each independently a hydrogen atom, fluorine atom, chlorine atom, bromine atom, cyano group, alkoxycarbonyl group, fluoroalkyl group, alkoxy group, hydroxy group, acetyl group, sulfonic acid ester or sulfone, with the proviso that all of $Y^1$ to $Y^4$ are not hydrogen at the same time. The subscript c is a positive number. It is noted that the sum of a+c or a+b1+b2+c may be either 100 mol % of the total of entire recurring units or less than 100 mol %, with other recurring units being included.

Examples of suitable alkyl groups represented by $R^1$, $R^3$ to $R^{11}$ and $R^{13}$ include methyl, ethyl, propyl, isopropyl, n-butyl, isobutyl, tert-butyl, pentyl, cyclopentyl, hexyl, cyclohexyl, and octyl. In the case of $R^3$ to $R^9$, an ether, lactone or ester may intervene, or a hydrogen atom may be substituted with a hydroxy or cyano group. Suitable fluoroalkyl groups are the foregoing alkyl groups in which some or all of the hydrogen atoms are replaced by fluorine atoms. The subscript "b" is an integer of 1 to 20, preferably 1 to 6.

The alkoxycarbonyl groups represented by $R^{13}$ and $Y^1$ to $Y^4$ are preferably those of 2 to 12 carbon atoms, more preferably 4 to 8 carbon atoms, for example, t-butoxycarbonyl and ethylcyclopentyloxycarbonyl. The fluoroalkyl and alkoxy groups represented by $Y^1$ to $Y^4$ are preferably those of 1 to 10 carbon atoms, more preferably 1 to 8 carbon atoms.

Illustrative examples of the recurring units "a" of formula (1) are given below.

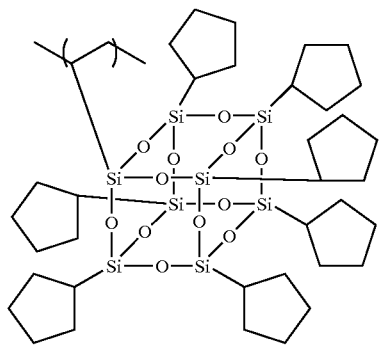

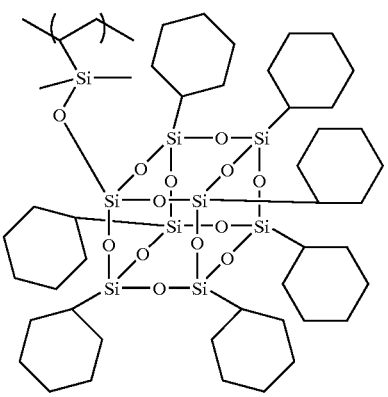

-continued

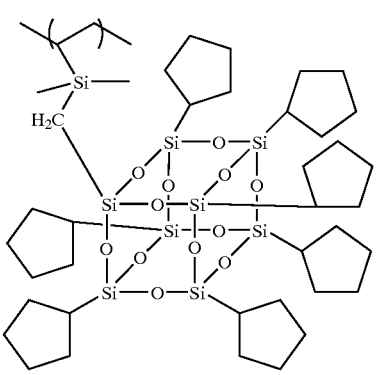

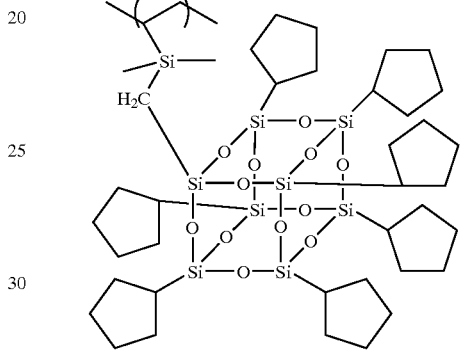

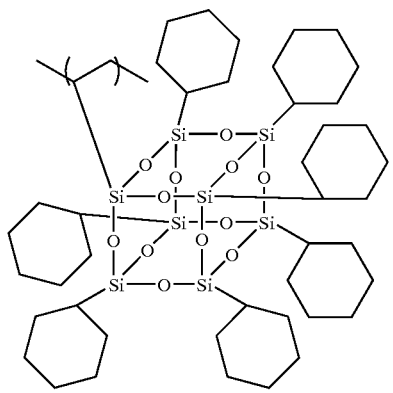

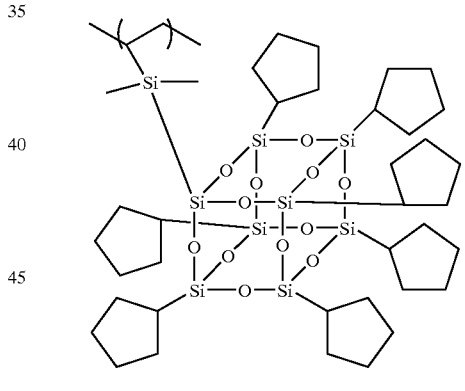

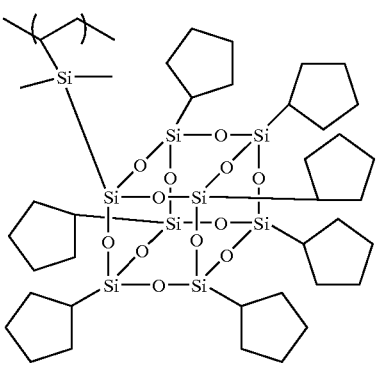

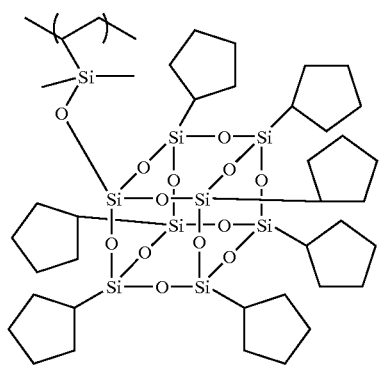

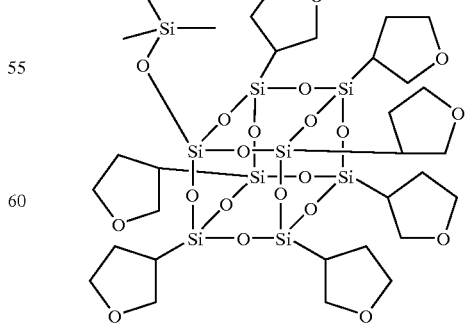

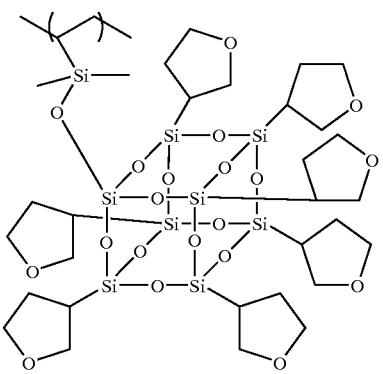

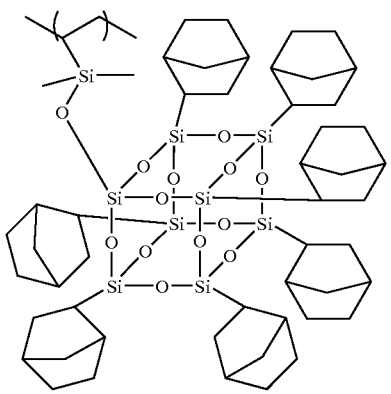
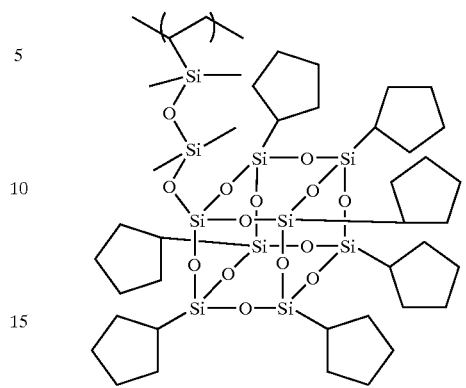
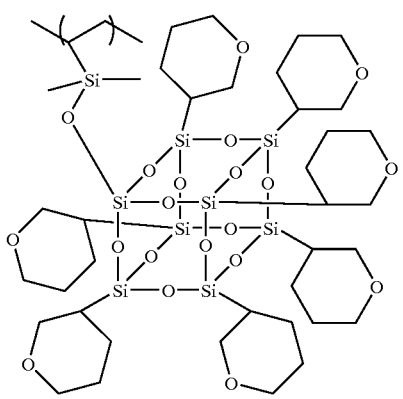
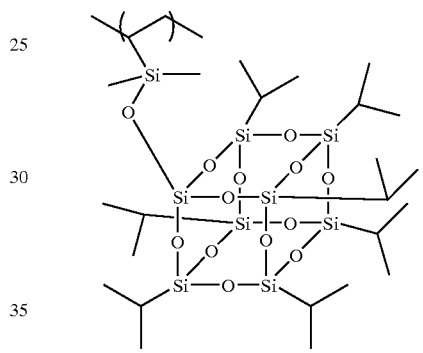
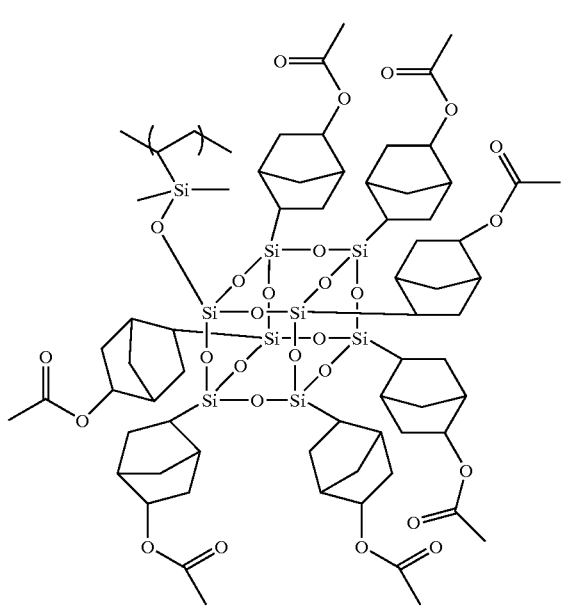
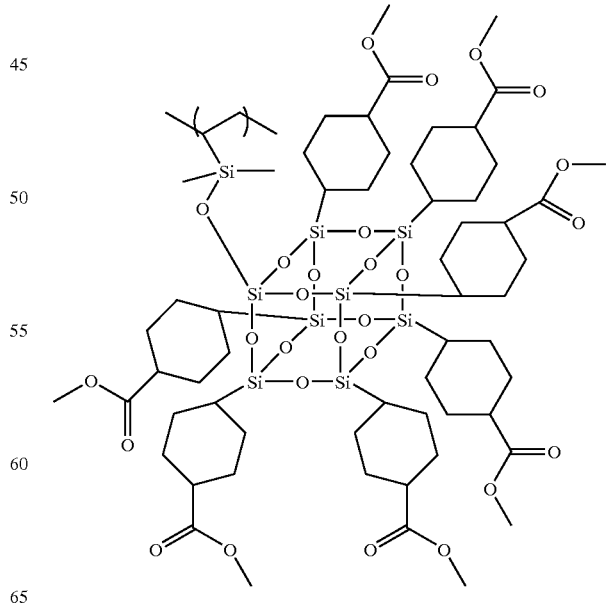

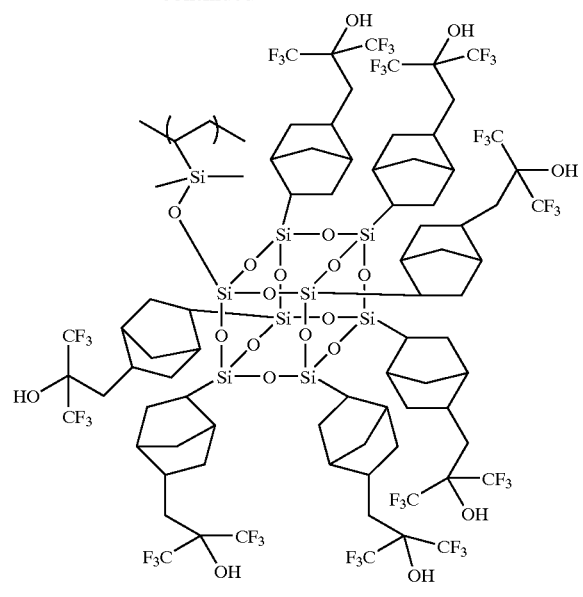
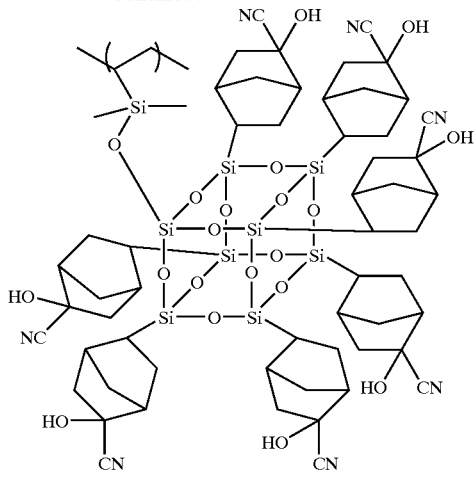
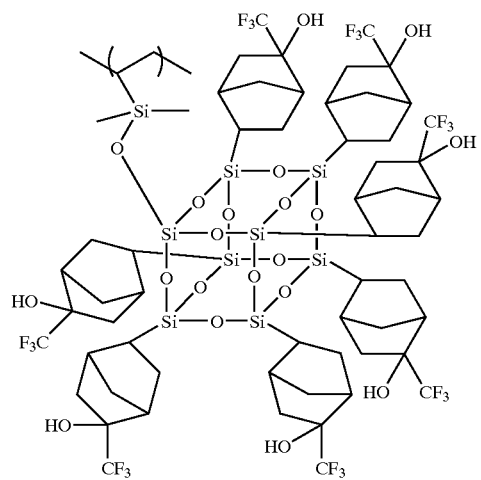
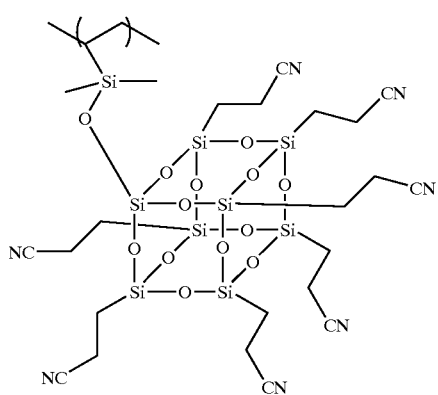

The recurring units "a" of formula (1) are silsesquioxanes of the cage structure as shown above, although it is acceptable that some siloxane bonds are cleaved to take a silanol form as shown below. Although the positions of silanol cleavage are not particularly limited, the cleavage of four or more of the twelve siloxane bonds is undesirable because the resulting polymer has a lower Tg or lower resistance to oxygen etching.

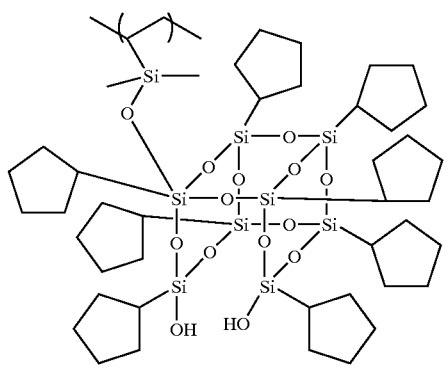
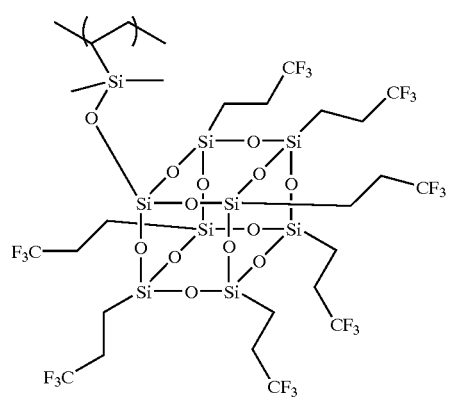

The monomer from which the recurring units "a" of formula (1) are derived is an olefin having as a pendant a silsesquioxane of cage structure represented by the general formula (1') below.

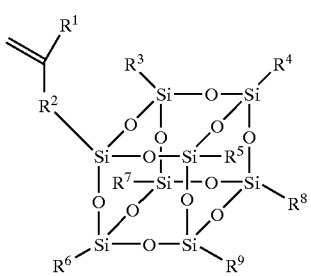
(1')
In the formula, $R^1$ to $R^9$ are as defined above.
Illustrative examples of the recurring units "b1" and "b2" of formula (3) are given below as (b1)-1 through (b1)-11 and (b2)-1.
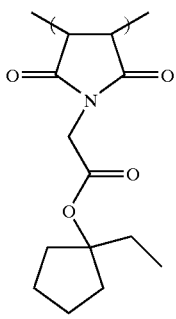
(b1)-1, (b1)-2, (b1)-3, (b1)-4
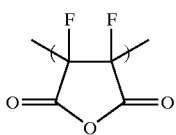
(b1)-5
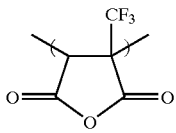
(b1)-6
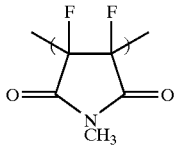
(b1)-7
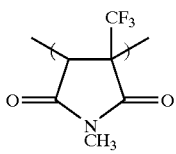
(b1)-8
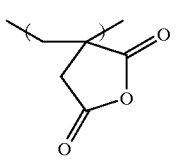
(b1)-9, (b1)-10, (b1)-11
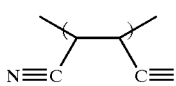
(b2)-1
Illustrative examples of the recurring units "c" copolymerizable with the silicon-containing recurring units in the general formula (4) are given below as (c)-1 through (c)-36.
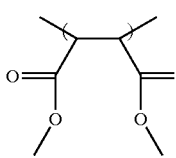
(c)-1, (c)-2

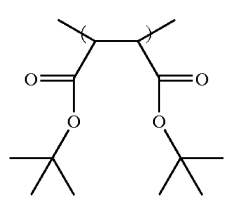 (c)-3
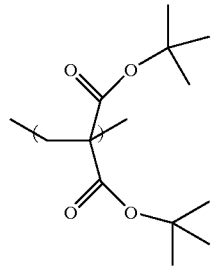 (c)-4
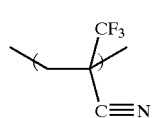 (c)-5
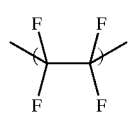 (c)-6
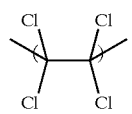 (c)-7
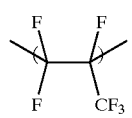 (c)-8
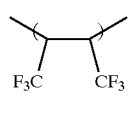 (c)-9
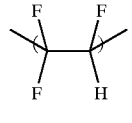 (c)-10
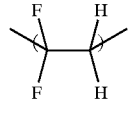 (c)-11
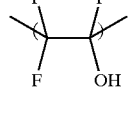 (c)-12
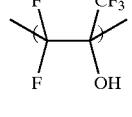 (c)-13
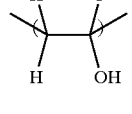 (c)-14
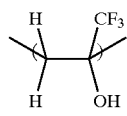 (c)-15
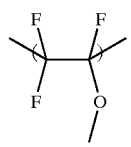 (c)-16
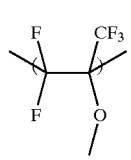 (c)-17
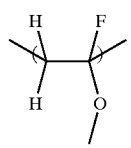 (c)-18
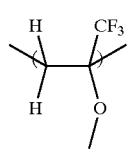 (c)-19
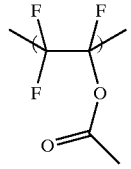 (c)-20
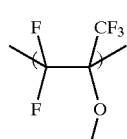 (c)-21
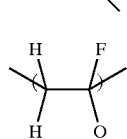 (c)-22
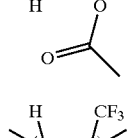 (c)-23
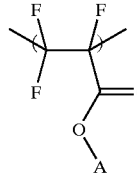 (c)-24

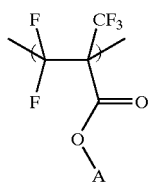
(c)-25
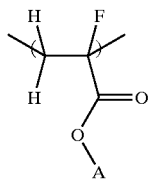
(c)-26
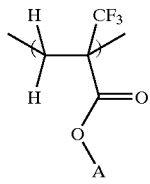
(c)-27
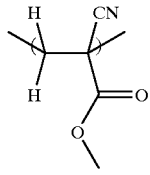
(c)-28
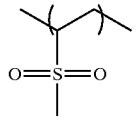
(c)-29
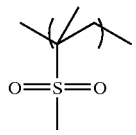
(c)-30
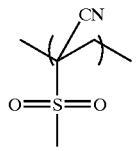
(c)-31
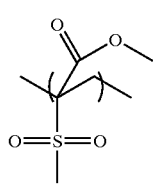
(c)-32
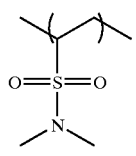
(c)-33
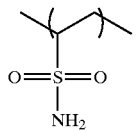
(c)-34
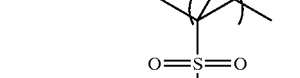
(c)-35
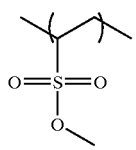
(c)-36
Examples of the acid labile group-bearing recurring units include units (b1)-6 and (b1)-7 among units "b1" and units (c)-3, (c)-24 to (c)-27, and (c)-35 among units "c" in the general formulae (3) and (4) as well as acid labile group-bearing recurring units of the general formulae (d)-1 to (d)-7 below.
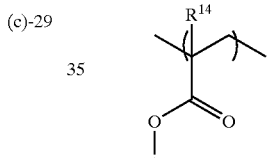
(d1)
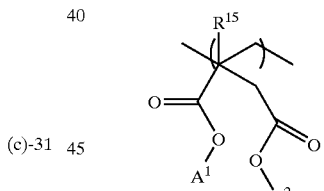
(d2)
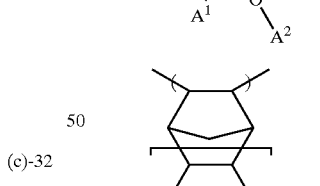
(d3)
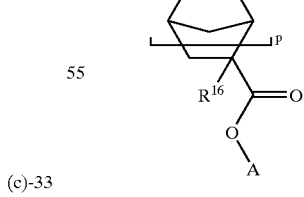
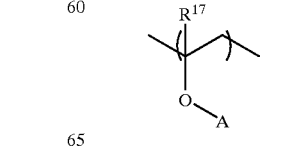
(d4)

-continued (d5)
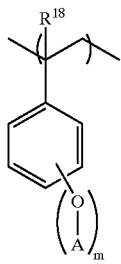

(d6)
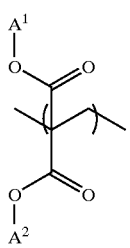

(d7)
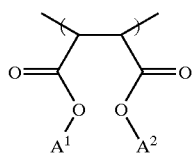

$R^{14}$ to $R^{18}$ are each hydrogen, a $C_1$–$C_{20}$ alkyl group, $C_6$–$C_{20}$ aryl group, $C_1$–$C_{20}$ haloalkyl group, or cyano group; "A" is an acid labile group, p is 0 or 1, m is 1 or 2, both or either one of $A^1$ and $A^2$ is an acid labile group, and one of $A^1$ and $A^2$ is hydrogen, a $C_1$–$C_{20}$ alkyl group or adhesive group when it is not an acid labile group.

Examples of suitable alkyl groups include those of 1 to 6 carbon atoms, such as methyl, ethyl, propyl, butyl, tert-butyl, pentyl, cyclopentyl, hexyl, and cyclohexyl. Suitable haloalkyl groups are the foregoing alkyl groups in which some or all of the hydrogen atoms are replaced by halogen atoms such as fluorine and chlorine atoms. Examples of suitable aryl groups include those of 6 to 10 carbon atoms, such as phenyl and naphthyl.

The acid labile groups are selected from a variety of such groups, and preferably from among groups of the formulae (A-1), (A-2) and (A-3) below.

(A-1)
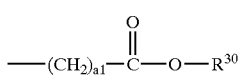

(A-2)
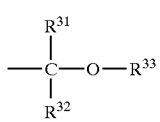

(A-3)
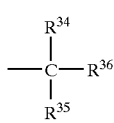

In formula (A-1), $R^{30}$ is a tertiary alkyl group having 4 to 20 carbon atoms, preferably 4 to 15 carbon atoms, a trialkylsilyl group in which each alkyl moiety has 1 to 6 carbon atoms, an oxoalkyl group having 4 to 20 carbon atoms, or a group of formula (A-3). Suitable tertiary alkyl groups include tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript "a1" is an integer of 0 to 6.

In formula (A-2), each of $R^{31}$ and $R^{32}$ is a hydrogen atom or a straight, branched or cyclic alkyl group of 1 to 18 carbon atoms, preferably 1 to 10 carbon atoms, such as methyl, ethyl, propyl, isopropyl, n-butyl, sec-butyl, tert-butyl, cyclopentyl, cyclohexyl, 2-ethylhexyl and n-octyl. $R^{33}$ is selected from monovalent hydrocarbon groups of 1 to 18 carbon atoms, preferably 1 to 10 carbon atoms, which may contain a hetero atom such as oxygen atom, for example, straight, branched or cyclic alkyl groups, and substituted alkyl groups in which some hydrogen atoms are substituted with hydroxyl, alkoxy, oxo, amino or alkylamino groups. Illustrative examples of substituted alkyl groups are shown below.

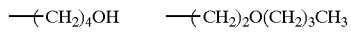
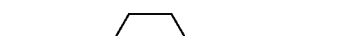
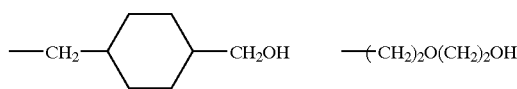
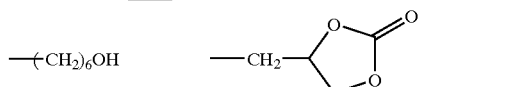
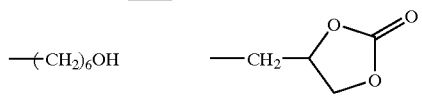

A pair of $R^{11}$ and $R^{32}$, $R^{31}$ and $R^{33}$, or $R^{32}$ and $R^{33}$ may form a ring with the carbon atom to which they are attached. Each of $R^{31}$, $R^{32}$ and $R^{33}$ is a straight or branched alkylene group of 1 to 18 carbon atoms, preferably 1 to 10 carbon atoms, when they form a ring.

Illustrative, non-limiting, examples of the acid labile group of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups of formulae (A-1)-1 to (A-1)-9 below.

(A-1)-1
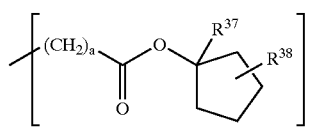

(A-1)-2
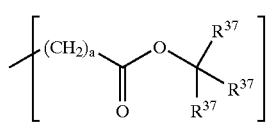

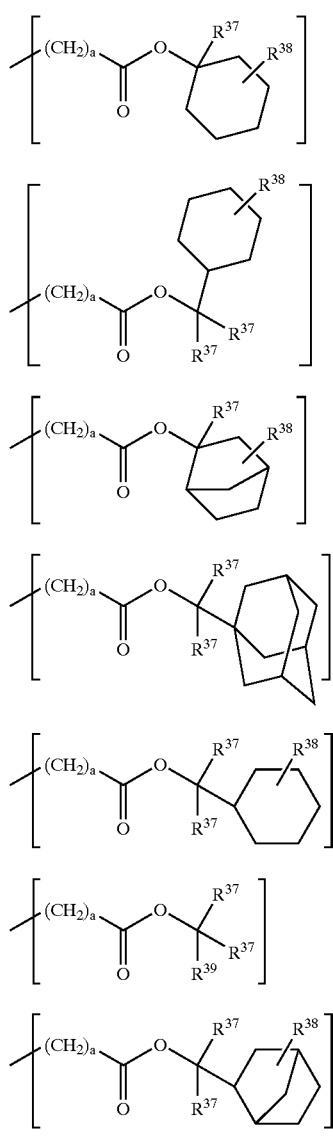

In the above formulae, $R^{37}$ is each independently a straight, branched or cyclic $C_1$–$C_{10}$ alkyl group or a $C_6$–$C_{20}$ aryl group such as phenyl; $R^{38}$ is a hydrogen atom or a straight, branched or cyclic $C_1$–$C_{10}$ alkyl group; and $R^{39}$ is each independently a straight, branched or cyclic $C_2$–$C_{10}$ alkyl group or a $C_6$–$C_{20}$ aryl group such as phenyl.

Of the acid labile groups of formula (A-2), straight or branched groups are exemplified by those of formulae (A-2)-1 to (A-2)-23 below.

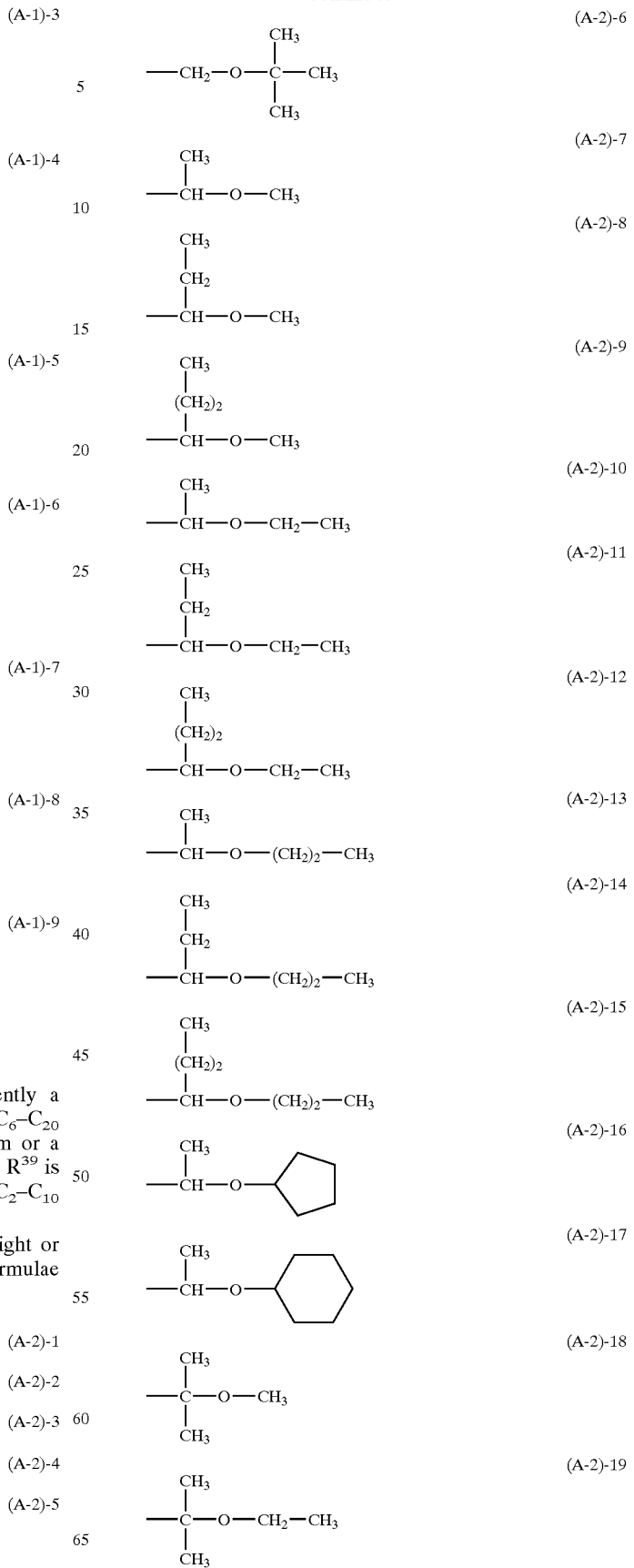

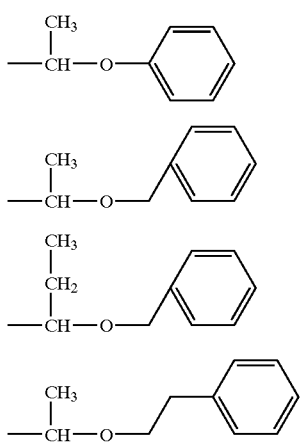

(A-2)-20
(A-2)-21
(A-2)-22
(A-2)-23

Of the acid labile groups of formula (A-2), examples of cyclic groups include tetrahydrofuran-2-yl, 2-methyltetrahydrofuran-2-yl, tetrahydropyran-2-yl and 2-methyltetrahydropyran-2-yl.

In an alternative embodiment, the polymer may be crosslinked within the molecule or between molecules with acid labile groups of the general formula (A-2a) or (A-2b).

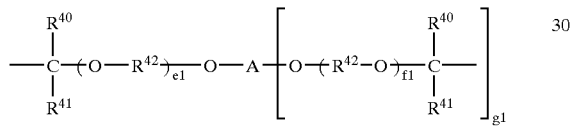

(A-2a)

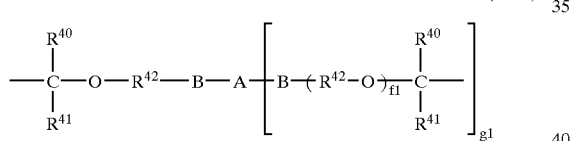

(A-2b)

Herein $R^{40}$ and $R^{41}$ each are hydrogen or a straight, branched or cyclic $C_1$–$C_8$ alkyl group, or $R^{40}$ and $R^{41}$, taken together, may form a ring with the carbon atom to which they are attached, and $R^{40}$ and $R^{41}$ are straight or branched $C_1$–$C_8$ alkylene groups when they form a ring; $R^{42}$ is a straight, branched or cyclic $C_1$–$C_{10}$ alkylene group; the subscripts e1 and f1 are 0 or integers of 1 to 10, and preferably 0 or integers of 1 to 5; g1 is an integer of 1 to 7; "A" is a (g1+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic $C_1$–$C_{20}$ alkylene groups, alkyltriyl groups, alkyltetrayl groups and $C_6$–$C_{30}$ arylene groups, which may be separated by a hetero atom and in which some of the hydrogen atoms attached to carbon atoms may be substituted with hydroxyl, carboxyl or acyl groups or halogen atoms. The subscript g1 is preferably an integer of 1 to 3.

The crosslinking acetal groups of formulae (A-2a) and (A-2b) are exemplified by the following formulae (A-2)-24 through (A-2)-31.

(A-2)-24
(A-2)-25
(A-2)-26
(A-2)-27
(A-2)-28
(A-2)-29
(A-2)-30
(A-2)-31

Referring to formula (A-3), each of $R^{34}$, $R^{35}$ and $R^{36}$ is a monovalent hydrocarbon group, typically a straight, branched or cyclic $C_1$–$C_{20}$ alkyl group, which may contain a hetero atom such as oxygen, sulfur, nitrogen or fluorine. A pair of $R^{34}$ and $R^{35}$, $R^{34}$ and $R^{36}$, or $R^{35}$ and $R^{36}$ may bond together to form a ring of 3 to 20 carbon atoms with the carbon atom to which they are attached.

Suitable tertiary alkyl groups of formula (A-3) include, but are not limited to, tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Also included in the tertiary alkyl groups are those of formulae (A-3)-1 to (A-3)-18 below.

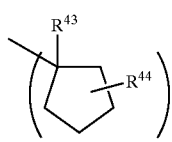

(A-3)-1

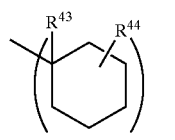
(A-3)-2
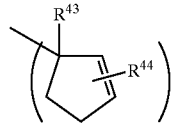
(A-3)-3
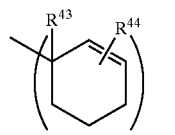
(A-3)-4
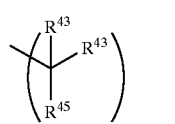
(A-3)-5
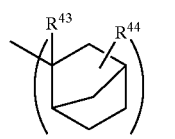
(A-3)-6
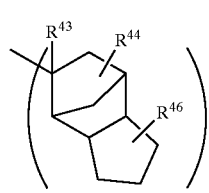
(A-3)-7
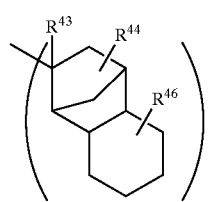
(A-3)-8
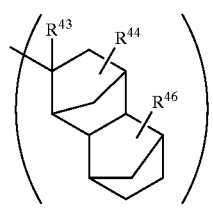
(A-3)-9
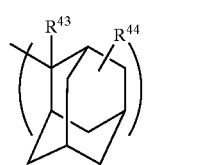
(A-3)-10
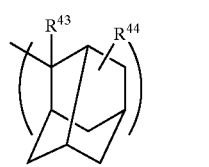
(A-3)-11
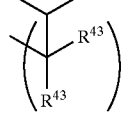
(A-3)-12
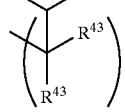
(A-3)-13
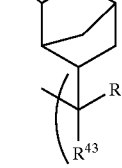
(A-3)-14
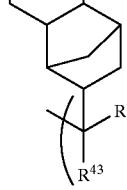
(A-3)-15
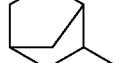
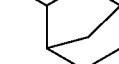
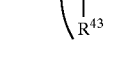
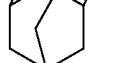
(A-3)-16
(A-3)-17

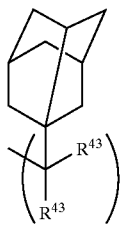
(A-3)-18

In the above formulae (A-3)-1 to (A-3)-18, $R^{43}$ is each independently a straight, branched or cyclic $C_1$–$C_8$ alkyl group or a $C_6$–$C_{20}$ aryl group, typically phenyl; each of $R^{44}$ and $R^{46}$ is hydrogen or a straight, branched or cyclic $C_1$–$C_{20}$ alkyl group; and $R^{45}$ is a $C_6$–$C_{20}$ aryl group, typically phenyl.

In a further embodiment, the polymer may be crosslinked within the molecule or between molecules with groups containing a di- or polyvalent alkylene or arylene group ($R^{47}$), as represented by the general formula (A-3)-19 or (A-3)-20.

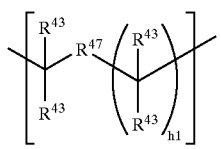
(A-3)-19

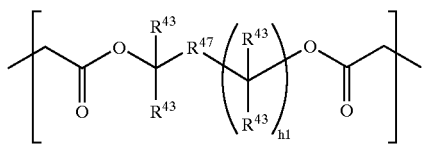
(A-3)-20

In formulae (A-3)-19 and (A-3)-20, $R^{43}$ is as defined above; $R^{47}$ is a straight, branched or cyclic $C_1$–$C_{20}$ alkylene group or an arylene group such as phenylene, which may contain a hetero atom such as oxygen, sulfur or nitrogen atom; h1 is an integer of 1 to 3.

In formulae (A-1), (A-2) and (A-3), $R^{30}$, $R^{33}$ and $R^{36}$ are independently selected from substituted or unsubstituted aryl groups, typically phenyl, p-methylphenyl, p-ethylphenyl and alkoxy-substituted phenyl groups such as p-methoxyphenyl, aralkyl groups such as benzyl and phenethyl, the foregoing groups which contain an oxygen atom or the foregoing groups in which a hydrogen atom attached to a carbon atom is substituted with a hydroxyl group or two hydrogen atoms are substituted with an oxygen atom to form a carbonyl group, i.e., alkyl and oxoalkyl groups as shown below.

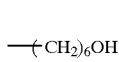
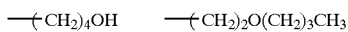
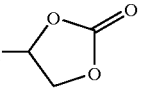
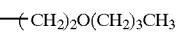
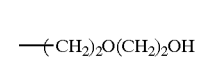

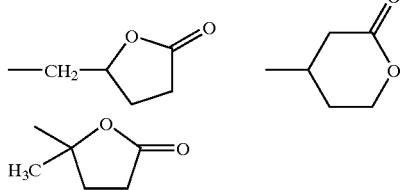

Examples of the trialkylsilyl group whose alkyl moiety each has 1 to 6 carbon atoms used as the acid labile group include trimethylsilyl, triethylsilyl and tert-butyldimethylsilyl.

Also useful are silicon-containing acid labile groups of formulae (A-4), (A-5) and (A-6) as shown below.

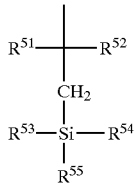
(A-4)

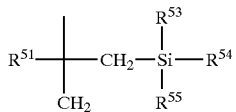
(A-5)

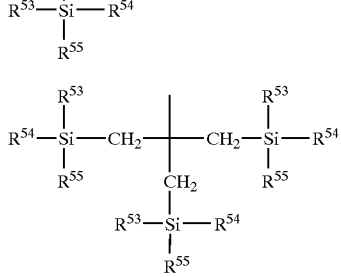
(A-6)

Herein $R^{51}$ and $R^{52}$ each are hydrogen or a $C_1$–$C_{20}$ alkyl group, $R^{53}$, $R^{54}$ and $R^{55}$ are each independently a $C_1$–$C_{20}$ alkyl or haloalkyl group, a $C_6$–$C_{20}$ aryl group, or a silicon-containing group which is attached to the silicon atom through a siloxane or silmethylene linkage. Alternatively, $R^{51}$ and $R^{52}$, taken together, may form a ring of 3 to 10 carbon atoms with the carbon atom to which they are attached. Also, a pair of $R^{53}$ and $R^{54}$, a pair of $R^{53}$ and $R^{55}$ or a pair of $R^{54}$ and $R^{55}$, taken together, may form a siloxane ring of 3 to 10 silicon atoms with the silicon atom to which they are attached.

Illustrative examples of the groups of formulae (A-4), (A-5) and (A-6) are given below as formulae (A-4)-1 through (A-4)-12, (A-5)-1 and (A-6)-1.

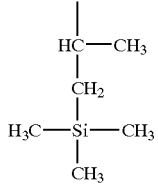
(A-4)-1

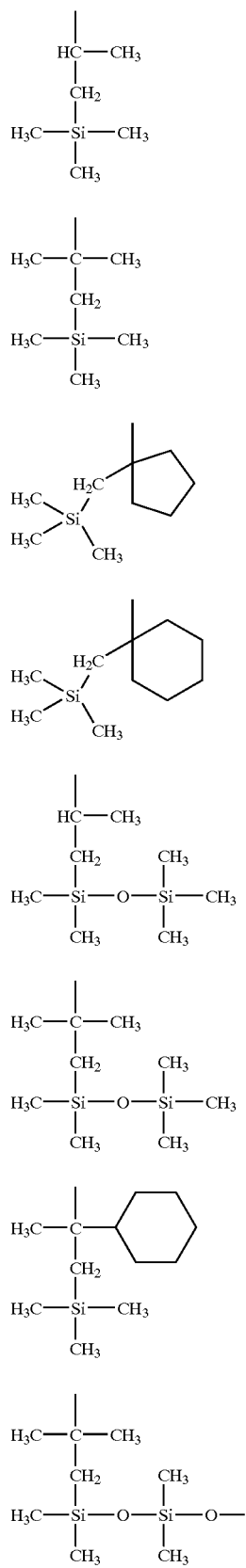
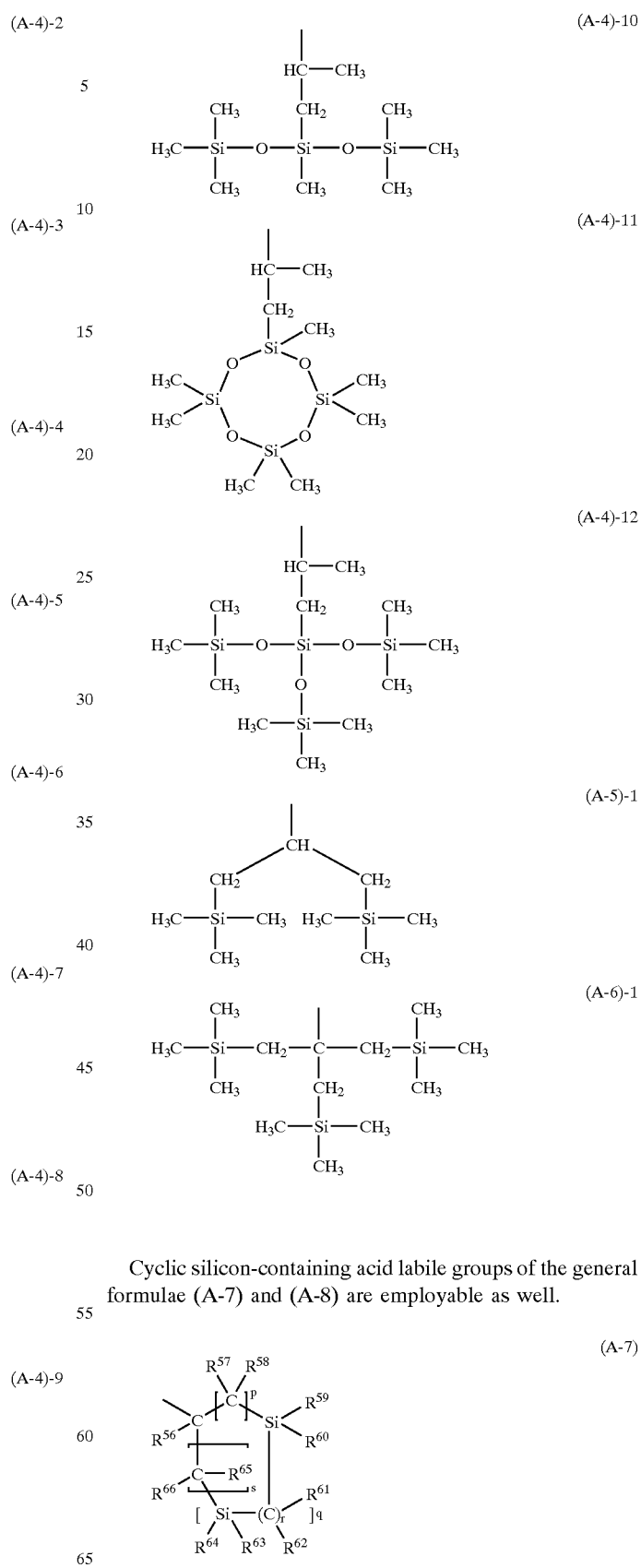
Cyclic silicon-containing acid labile groups of the general formulae (A-7) and (A-8) are employable as well.

(A-8)

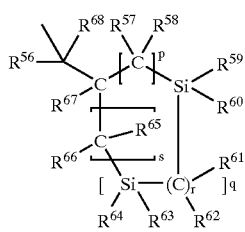

Herein $R^{56}$ and $R^{68}$ each are a straight, branched or cyclic $C_1$–$C_{20}$ alkyl group, $R^{57}$, $R^{58}$, $R^{61}$, $R^{62}$, $R^{65}$ and $R^{66}$ each are hydrogen or a straight, branched or cyclic $C_1$–$C_{20}$ alkyl group, $R^{59}$, $R^{60}$, $R^{63}$ and $R^{64}$ each are hydrogen, a straight, branched or cyclic $C_1$–$C_{20}$ alkyl or $C_1$–$C_{20}$ fluoroalkyl group, or $C_6$–$C_{20}$ aryl group, p, q, r and s each are an integer of 0 to 10, satisfying $1 \leq p+q+s \leq 20$.

Illustrative examples of the groups of formulae (A-7) and (A-8) are shown below as formulae (A-7)-1 through (A-8)-6.

(A-7)-1

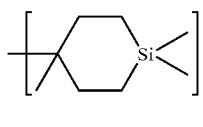

(A-7)-2

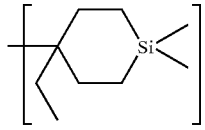

(A-7)-3

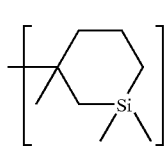

(A-7)-4

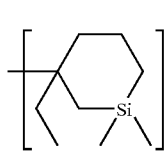

(A-7)-5

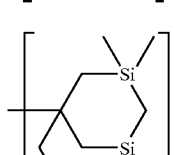

(A-7)-6

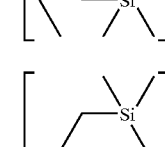

(A-8)-1

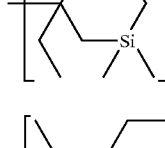

(A-8)-2

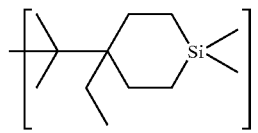

(A-8)-3

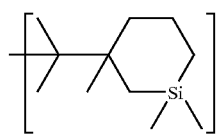

(A-8)-4

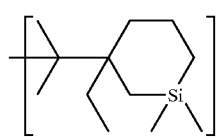

(A-8)-5

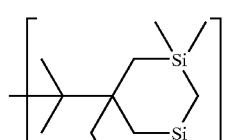

(A-8)-6

Also included are acid labile groups of the general formula (A-9) below.

(A-9)

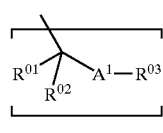

Herein, $A^1$ is a divalent group selected from among furandiyl, tetrahydrofurandiyl and oxanorbornanediyl; $R^{01}$ and $R^{02}$ are each independently a monovalent, straight, branched or cyclic $C_1$–$C_{10}$ hydrocarbon group, or $R^{01}$ and $R^{02}$, taken together, may form an aliphatic hydrocarbon ring with the carbon atom to which they are attached; and $R^{03}$ is hydrogen or a monovalent, straight, branched or cyclic $C_1$–$C_{10}$ hydrocarbon group which may contain a hetero atom.

The oxygen-containing acid labile groups of formulae (A-9) are represented by formulae (A-9)-1 and (A-9)-2.

(A-9)-1

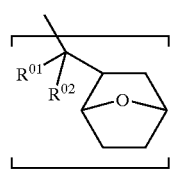

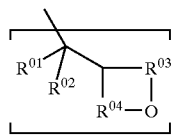
(A-9)-2
Herein, $R^{01}$ and $R^{02}$ are as defined above, $R^{03}$ and $R^{04}$ are each a single bond or a $C_1$–$C_4$ alkylene group, or $R^{03}$+$R^{04}$ may be a $C_3$–$C_6$ alkylene group which may contain a double bond.
Illustrative examples of the oxygen-containing acid labile group of formulae (A-9)-1 and (A-9)-2 are shown below. Note that Me is methyl and Ac is acetyl.
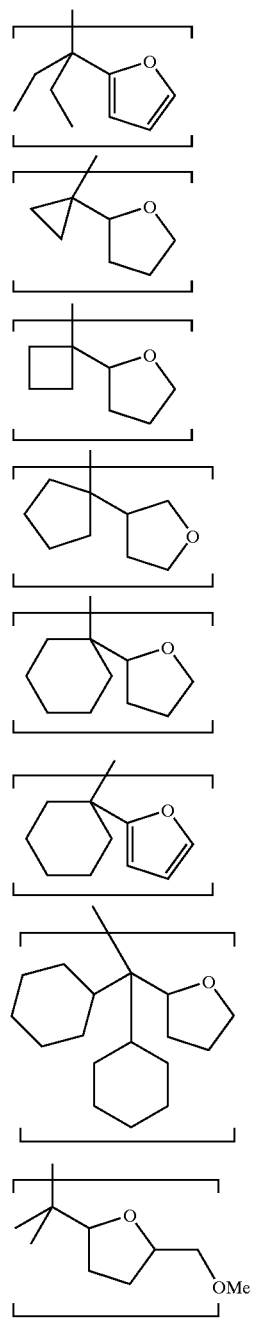
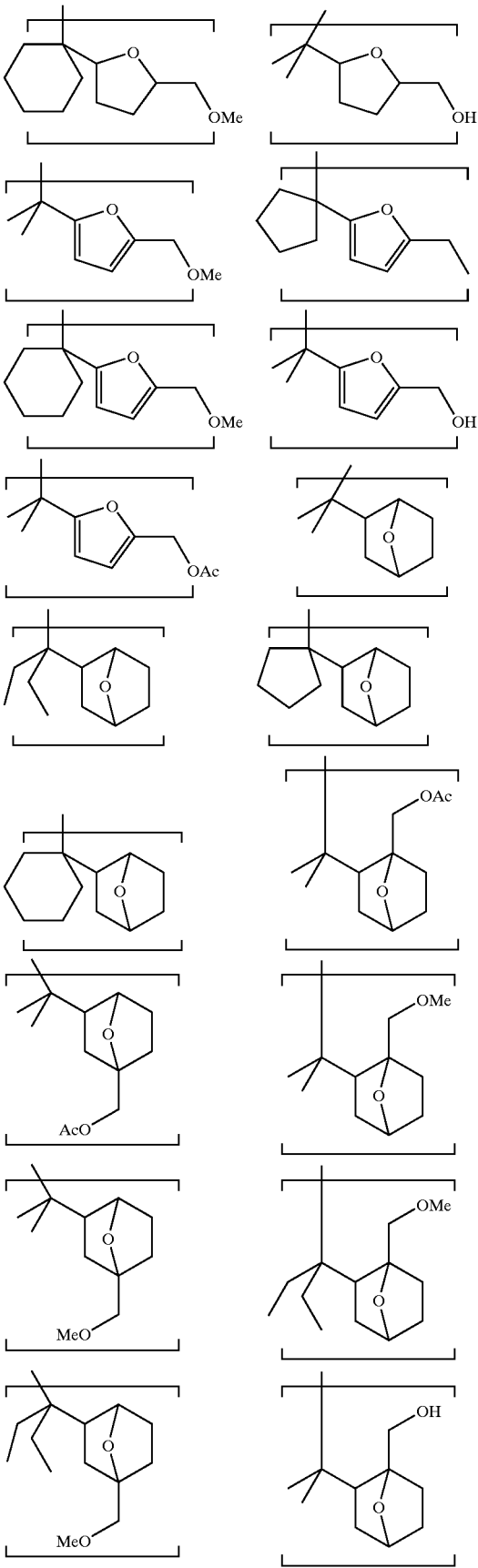

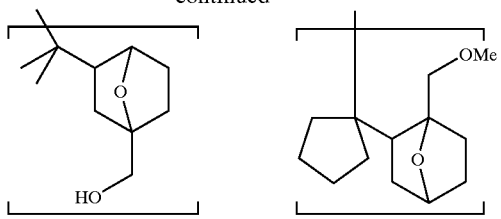
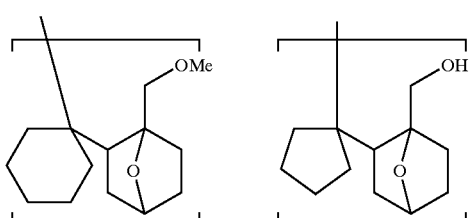
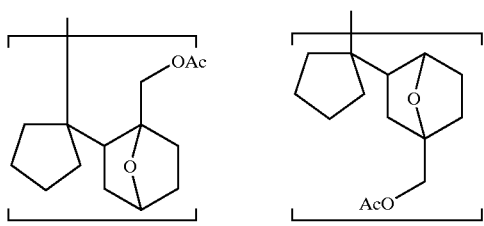
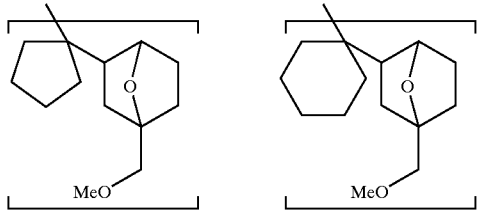
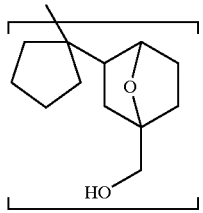
In addition to the units described above, the polymer of the invention may have further copolymerized therewith a monomer which serves to increase the silicon content for enhancing dry etching resistance. Such recurring units derived from silicon-containing monomers are exemplified below.
(Si-1)
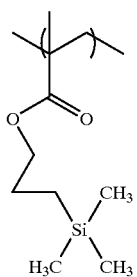
(Si-2)
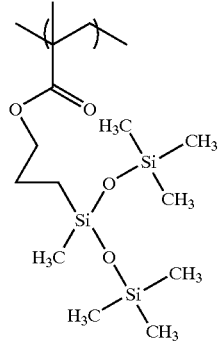
(Si-3)
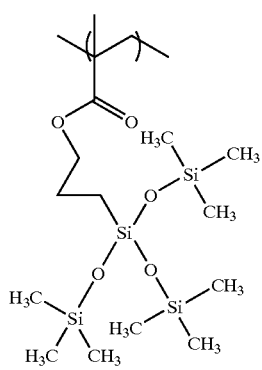
(Si-4)
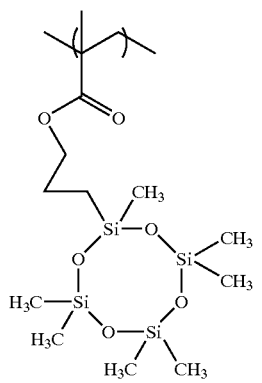
(Si-5)
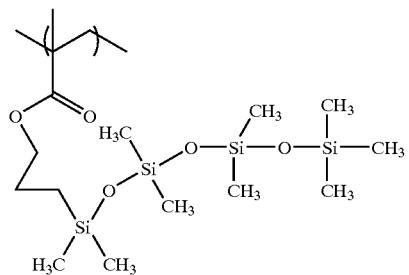

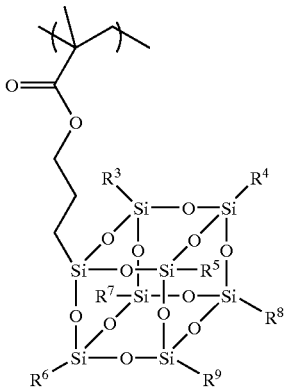

(Si-6)

Note that $R^3$ to $R^9$ are as defined previously.

The polymer of the invention can be obtained by copolymerizing recurring units "a" obtained through polymerization of an olefin having POSS structure represented by formula (1), with recurring units "b1" or "b2" in formula (3) or recurring units "c" in formula (4), and optionally, recurring units "d" selected from formulae (d1) to (d7).

When the characteristics of the resist composition are taken into account, the subscripts a, b1, b2, c and d are preferably positive numbers, satisfying the following relationship.

That is, when the polymer of the invention is used as photoresist, the preferred polymerization ratio is $0<a/(a+b1+b2+c+d)\leq 0.7$, more preferably $0.01<a/(a+b1+b2+c+d)\leq 0.6$; $0.1\leq(b1+b2+c)/(a+b1+b2+c+d)\leq 0.8$, more preferably $0.2\leq(b1+b2+c)/(a+b1+b2+c+d)\leq 0.7$; and $0.1\leq d/(a+b1+b2+c+d)\leq 0.7$, more preferably $0.2\leq d/(a+b1+b2+c+d)\leq 0.6$.

Smaller amounts of units "a" lead to a lower silicon content, resulting in a lowering of resistance to oxygen gas etching. Smaller amounts of units "b1", "b2" and "c" lead to a lower proportion of adhesive groups and hence, a lowering of adhesion, which allows for pattern stripping and scum formation after development. Smaller amounts of units "d" lead to a lower proportion of acid labile groups, resulting in a lowering of dissolution contrast and a failure of pattern resolution. If the proportion of any unit is too large, the proportion of the remaining units becomes lower, failing to achieve a good balance of etching resistance, adhesion and dissolution contrast. Pattern dimensions, pattern shape and etching resistance may be controlled as desired by selecting appropriate values of a, b1, b2, c and d within the above ranges.

When the polymer of the invention is applied to a pellicle membrane, it consists of units "a" and "c" because the recurring units "d" are unnecessary. In this case, the preferred range is $0.2\leq a/(a+c)\leq 0.8$.

The polymer of the invention is obtainable by polymerizing units "a" as an essential component and optionally, copolymerizing any suitable units selected from units "b1", "b2", "c" and "d". If desired, another component may be copolymerized. Suitable examples include (meth)acrylic acid derivatives, vinyl ether derivatives, allyl ether derivatives, cycloolefin compounds, styrene derivatives, and vinyl pyrrolidone. It is preferred that in the inventive polymer, a+b1+b2+c+d account for 30 to 100 mol %, especially 50 to 100 mol % of the total of entire recurring units.

The polymers may have a weight average molecular weight (Mw) of about 1,000 to 500,000, and preferably about 2,000 to 30,000. With too low Mw, polymers become less resistant to heat. Polymers with too high Mw have low alkali solubility and tend to induce a footing phenomenon after pattern formation.

It is recommended that multi-component copolymers containing units of formula (1) or (3) or (4) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.5.

Also contemplated herein are a blend of polymers having different molecular weights or dispersities, a blend of polymers having different acid labile groups, silicon-containing groups or adhesive groups, and polymer blends of different compositional ratios.

In one typical embodiment, the polymer can be synthesized by dissolving a POSS monomer and one or more copolymerizable monomer in an organic solvent, adding a radical initiator thereto, and effecting thermal polymerization. Examples of the organic solvent used herein include toluene, benzene, tetrahydrofuran, diethyl ether and dioxane. Examples of the radical initiator include 2,2'-azobisisobutyronitrile (AIBN), 2,2'-azobis(2,4-dimethylvarelonitrile), dimethyl 2,2-azobis(2-methylpropionate), benzoyl peroxide and lauroyl peroxide. Polymerization is preferably effected by heating at 50 to 80° C. The reaction time is usually about 2 to 100 hours, preferably about 5 to 20 hours. The polymerization method is not limited to the foregoing.

Resist Composition

The polymer of the invention can be used as a base resin in resist compositions. Therefore, a resist composition comprising the polymer is contemplated herein. The resist composition is preferably a chemical amplification type resist composition, and especially chemical amplification type positive working resist composition.

In one embodiment, the chemically amplified positive resist composition is defined as comprising (I) the above-defined polymer as a base resin, (II) a photoacid generator, and (III) an organic solvent, or as comprising (I) the above-defined polymer as a base resin, (II) a photoacid generator, (III) an organic solvent, and (IV) a dissolution inhibitor. In either case, the composition preferably further comprises (V) a basic compound.

Component (II)

Suitable examples of the photoacid generator (II) include onium salts of general formula (6) below, diazomethane derivatives of formula (7), glyoxime derivatives of formula (8), β-ketosulfone derivatives, disulfone derivatives, nitrobenzylsulfonate derivatives, sulfonic acid ester derivatives, and imidoyl sulfonate derivatives.

The onium salts used as the photoacid generator are of the general formula (6).

$$(R^{100})_c M^+ K^- \tag{6}$$

In formula (6), $R^{100}$, which may be the same or different, is a straight, branched or cyclic alkyl of 1 to 12 carbon atoms, an aryl of 6 to 12 carbon atoms, or an aralkyl of 7 to 12 carbon atoms; $M^+$ is iodonium or sulfonium; $K^-$ is a non-nucleophilic counter-ion; and c is 2 or 3.

Illustrative examples of alkyl groups represented by $R^{100}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 2,3,4,5,6-pentafluorobenzenesulfonate; and alkylsulfonate ions such as mesylate and butanesulfonate.

The diazomethane derivatives used as the photoacid generator are of the general formula (7).

(7)

In the formula, $R^{101}$ and $R^{102}$, which may be the same or different, are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{101}$ and $R^{102}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 2,3,4,5,6-pentafluorophenyl. Exemplary aralkyl groups include benzyl and phenethyl.

The glyoxime derivatives used as the photoacid generator are of the general formula (8).

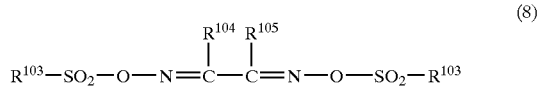

(8)

In the formula, $R^{103}$, $R^{104}$, and $R^{105}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{104}$ and $R^{105}$ may bond together to form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{103}$ to $R^{105}$ are exemplified by the same groups as mentioned above for $R^{101}$ and $R^{102}$. Examples of alkylene groups represented by $R^{104}$ and $R^{105}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethane-sulfonate, bis(p-tert-butoxyphenyl)phenylsulfonium trifluoromethane-sulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis(benzenesulfonyl)diazomethane, bis (p-toluenesulfonyl)diazomethane, bis(cyclohexylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, and bis(tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; and naphthoquinone diazide sulfonate derivatives. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 50 parts, especially 0.5 to 40 parts by weight per 100 parts by weight of the entire base resin. At less than 0.2 part, the amount of acid generated during exposure may be too small and the sensitivity and resolution be poor, whereas the addition of more than 50 parts may lower the transmittance of the resist and result in a poor resolution.

Component (III)

The organic solvent (III) used in the resist composition of the invention may be any organic solvent in which the base resin, photoacid generator, dissolution inhibitor and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, preferred are diethylene glycol dimethyl ether, 1-ethoxy-2-propanol and ethyl lactate, in which the photoacid generator is most soluble, and propylene glycol monomethyl ether acetate which is safe, and mixtures thereof.

Component (IV)

The dissolution inhibitor (IV) is a compound with a molecular weight of up to 3,000 which changes its solubility in an alkaline developer under the action of an acid. Typically, a compound obtained by partially or entirely substituting acid labile substituents on a phenol or carboxylic acid derivative having a molecular weight of up to 2,500 is added as the dissolution inhibitor. The acid labile groups may be those of the above formulae (A-1) to (A-8).

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4, 4'-diol], 4,4'-[2,2,2-trifluoro-1-(trifluoromethyl)ethylidene] bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl) methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol. Examples of suitable acid labile substituent groups are as exemplified for $R^4$.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]-bisphenol-4, 4'-di-t-butoxycarbonyl, bis(4-(2'-tetrahydropyranyloxy) phenyl)methane, bis(4-(2'-tetrahydrofuranyloxy)phenyl) methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy) phenyl)methane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropyloxy)phenyl)propane, tert-butyl 4,4-bis(4'-(2"-tetrahydropyranyloxy)phenyl)-valerate, tert-butyl 4,4-bis (4'-(2"-tetrahydrofuranyloxy)phenyl)-valerate, tert-butyl 4,4-bis(4'-tert-butoxyphenyl)valerate, tert-butyl 4,4-bis(4-tert-butoxycarbonyloxyphenyl)valerate, tert-butyl 4,4-bis (4'-tert-butoxycarbonylmethyloxyphenyl)-valerate, tert-butyl 4,4-bis(4'-(1"-ethoxyethoxy)phenyl)valerate, tert-butyl 4,4-bis(4'-(1"-ethoxypropyloxy)phenyl)valerate, tris (4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy) phenyl)methane, 1,1,2-tris(4'-(2"-tetrahydropyranyloxy) phenyl)ethane, 1,1,2-tris(4'-(2"-tetrahydrofuranyloxy) phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (IV) is up to about 20 parts, and especially up to about 15 parts by weight per 100 parts by weight of the solids in the composition. With more than 20 parts of the dissolution inhibitor, the resist composition becomes less heat resistant because of an increased content of monomer components.

Component (V)

The basic compound (V) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives. Of these, the aliphatic amines are preferred.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine) Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

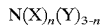
(B)-1

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

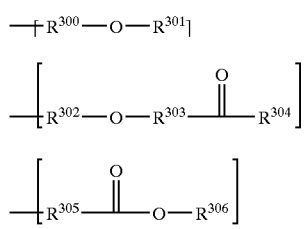

(X)-1
(X)-2
(X)-3

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy) ethyl}amine, tris{2-(1-ethoxypropoxy)ethyl}amine, tris[2-{2-(2-hydroxyethoxy)ethoxy)ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl] ethylamine, N,N-bis(2-acetoxyethyl)-2-[(2-oxotetrahydrofuran-3-yl)oxy-carbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl) ethylamine, N-(2-hydroxyethyl)-bis[2-(methoxycarbonyl) ethyl]amine, N-(2-acetoxyethyl)-bis[2-(methoxycarbonyl) ethyl]amine, N-(2-hydroxyethyl)-bis[2-(ethoxycarbonyl) ethyl]amine, N-(2-acetoxyethyl)-bis[2-(ethoxycarbonyl) ethyl]amine, N-(3-hydroxy-1-propyl)-bis[2-(methoxycarbonyl)ethyl]amine, N-(3-acetoxy-1-propyl)-bis [2-(methoxycarbonyl)ethyl]amine, N-(2-methoxyethyl)-bis [2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris (methoxycarbonylmethyl)amine, tris (ethoxycarbonylmethyl)amine, N-butyl-bis (methoxycarbonylmethyl)amine, N-hexyl-bis (methoxycarbonylmethyl)amine, and β-(diethylamino)-δ-valerolactone.

Also useful are one or more of cyclic structure-bearing basic compounds having the following general formula (B)-2.

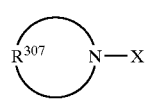
(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino) propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

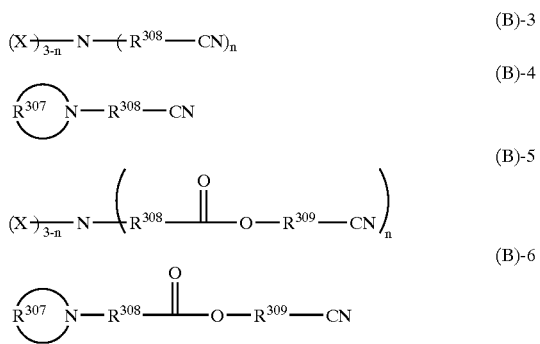

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds include 3-(diethylamino)propionitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compounds may be used alone or in admixture of two or more. The basic compound is preferably formulated in an amount of 0.001 to 2 parts, and especially 0.01 to 1 part by weight, per 100 parts by weight of the entire base resin in the resist composition. Less than 0.001 part of the basic compound may fail to provide the desired effect whereas more than 2 parts of the basic compound may result in too low a sensitivity.

The resist composition of the invention may include, as an optional ingredient, a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, and fluorinated organosiloxane compounds. Illustrative examples include Fluorad FC-430 and FC-431 from Sumitomo 3M Ltd., Surflon S-141, S-145, S-381 and S-383 from Asahi Glass Co., Ltd., Unidyne DS-401, DS-403, and DS-451 from Daikin Industries Ltd., Megaface F-8151, F-171, F-172, F-173 and F-177 from Dainippon Ink & Chemicals, Inc., and X-70-092 and X-70-093 from Shin-Etsu Chemical Co., Ltd. Preferred surfactants include Fluorad FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 μm, which is then pre-baked on a hot plate at 60 to 200° C. for 10 seconds to 10 minutes, and preferably at 80 to 150° C. for 30 seconds to 5 minutes. A patterning mask having the desired pattern may then be placed over the resist film, and the film exposed through the mask to an electron beam or to high-energy radiation having a wavelength of less than 300 nm, such as deep-UV rays, excimer laser beams, or x-rays in a dose of about 1 to 200 mJ/cm$^2$, and preferably about 10 to 100 mJ/cm$^2$, then post-exposure baked (PEB) on a hot plate at 60 to 150° C. for 10 seconds to 5 minutes, and preferably at 80 to 130° C. for 30 seconds to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. Of the various types of high-energy radiation that may be used, the resist composition of the invention is best suited to micro-pattern formation with, in particular, deep-UV rays having a wavelength of 254 to 120 nm, an excimer laser, especially ArF (193 nm), Kr$_2$ (146 nm) or KrAr (134 nm) excimer laser or a laser, especially F$_2$ (157 nm) or Ar$_2$ (126 nm) laser, x-rays, or an electron beam. The desired pattern may not be obtainable outside the upper and lower limits of the above range.

Figure 1B:
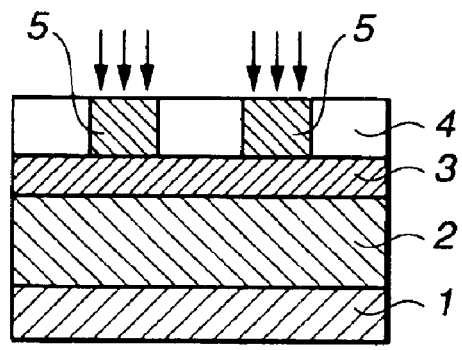
Figure 1C:
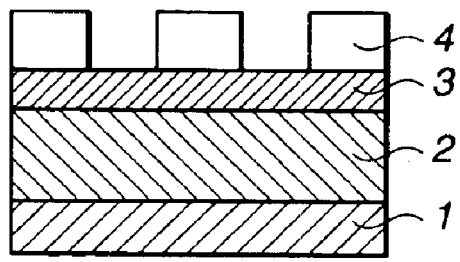
Figure 1D:
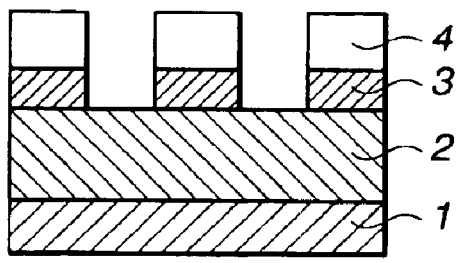
Figure 1E:
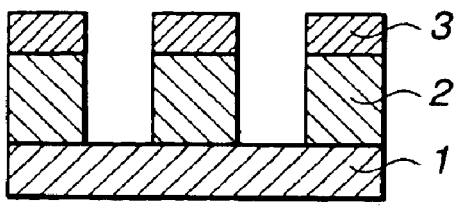

Referring to FIG. 1, there is illustrated in cross section a process involving forming a silicon-containing resist pattern through exposure, PEB and development steps, patterning an underlying organic film by oxygen gas etching, and processing a further underlying film by dry etching. In FIG. 1A, a layer structure includes a support substrate 1, a processable substrate 2 of SiO$_2$, SiN or the like, an organic film 3 of a novolak resin, polyhydroxystyrene or the like, and a resist layer 4 formed of the resist composition comprising the silicon-containing polymer of the invention. In FIG. 1B, selected areas 5 of the resist layer 4 are exposed to light. PEB and development are then carried out to remove the exposed areas as shown in FIG. 1C. In FIG. 1D, the exposed areas of the organic film 3 are etched away with oxygen plasma. In FIG. 1E, the exposed areas of the processable substrate 2 are etched away with CF gas, completing the pattern.

The oxygen gas etching is a reactive plasma etching using oxygen gas as a main component and can process the underlying organic film at a high aspect ratio. SO$_2$ or N$_2$ gas may be added to oxygen gas for protecting side walls for preventing the film from being configured to a T-top profile by overetching. Prior to the oxygen gas etching, brief etching with a fluorocarbon gas may be carried out for removing any scum of the resist after development and smoothening line edges to prohibit roughening. The subsequent dry etching of the processable film may be etching using a fluorocarbon gas as a main component when the processable film is SiO$_2$ or Si$_3$N$_4$. Exemplary fluorocarbon gases are CF$_4$, CHF$_3$, CH$_2$F$_2$, C$_2$F$_6$, C$_3$F$_8$, C$_4$F$_{10}$ and C$_5$F$_{12}$. At the same time as the dry etching of the processable film, the silicon-containing resist film can be stripped off. Etching with chlorine or bromine gas as a main component is employed when the processable film is polysilicon, tungsten silicide or TiN/Al.

Since the silicon-containing resist of the invention has excellent resistance to etching with chlorine or bromine gas as a main component, the processing technique may be the same as used for the single layer resist.

Figure 2A:
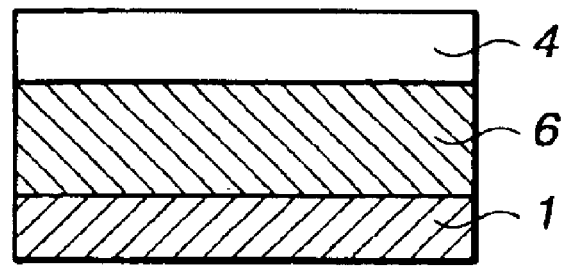
FIG. 2 schematically illustrates a patterning process involving chlorine etching.
Figure 2B:
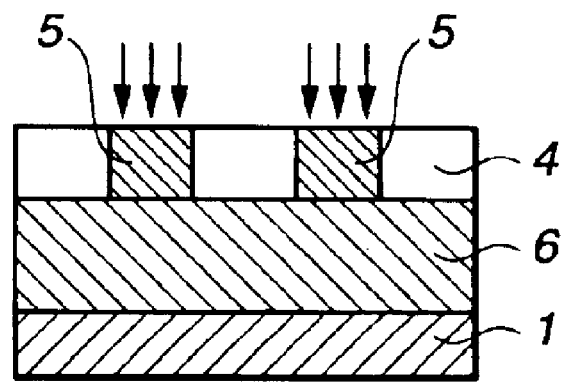
Figure 2C:
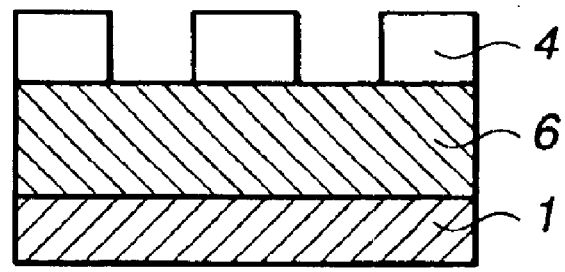
Figure 2D:
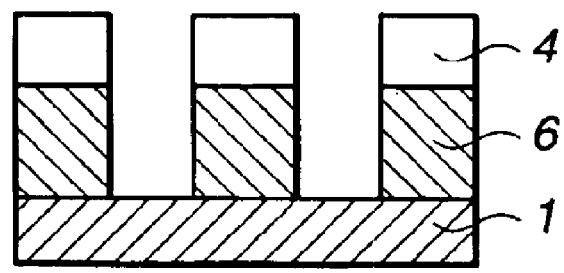

This embodiment is illustrated in FIG. 2. The layer structure shown in FIG. 2A includes a support substrate 1, a processable substrate 6, and a resist layer 4 according to the invention. Exposure of selected areas 5 of the resist layer 4 is followed by PEB and development as shown in FIGS. 2B and 2C. Thereafter, the processable substrate 6 is etched with a Cl gas as shown in FIG. 2D. In this embodiment, the silicon-containing resist film according to the invention is formed in a desired pattern directly on the processable film, which can be processed by etching with chlorine or bromine gas as a main component.

The resist composition comprising a silicon-containing polymer as a base resin according to the invention is sensitive to high-energy radiation, and has excellent sensitivity and resolution at a wavelength of less than 300 nm as well as satisfactory oxygen plasma etching resistance. These features of the inventive resist composition enable its use particularly in the bilayer resist technology, and permit a finely defined pattern having sidewalls perpendicular to the substrate to be easily be formed, making the resist ideal as a micropatterning material in VLSI fabrication.

EXAMPLE

Synthesis Examples and Examples are given below together with Comparative Examples for further illustrating the invention although the invention is not limited thereby. The abbreviations used herein are GPC for gel permeation chromatography, NMR for nuclear magnetic resonance, Mw for weight average molecular weight, Mn for number average molecular weight, and THF for tetrahydrofuran.
Synthesis of Silicon-Containing Polymers It is noted that Monomers 1 to 6 are shown at the end of Synthesis Examples.

Synthesis Example 1

In a 300-ml flask were admitted 9.8 g of maleic anhydride, 93 g of 1,3,5,7,9,11,13-heptacyclopentyl-15-vinylpentacyclo[9.5.1.1$^{3,9}$.1$^{5,15}$.1$^{7,13}$]octasiloxane (Monomer 1), and 100 g of THF as a solvent. The reactor was cooled to −70° C. in a nitrogen atmosphere, after which deaeration in vacuo and nitrogen blow were repeated three times. After warming to room temperature, 4.0 g of 2,2'-azobis(2,4-dimethylvaleronitrile) as a polymerization initiator was added. The reactor was heated to 55° C., at which reaction was conducted for 25 hours. The reaction solution was diluted with 5 ml of acetone and poured into 4.5 liters of isopropyl alcohol for precipitation. The white solid precipitate was collected by filtration and dried in vacuo at 40° C., yielding 56 g of a white polymer.

The polymer was analyzed by $^{13}$C— and $^1$H-NMR and GPC, with the results shown below.

Copolymer compositional ratio maleic anhydride:Monomer 1=48:52

Mw=8,600

Molecular weight dispersity (Mw/Mn)=1.99

This is designated Polymer 1.

Synthesis Example 2

In a 300-ml flask were admitted 9.8 g of maleic anhydride, 105 g of 1-(dimethylvinylsilyloxy)-3,5,7,9,11,13,15-heptacyclopentylpentacyclo-[9.5.1.1$^{3,9}$.1$^{5,15}$.1$^{7,13}$] octasiloxane (Monomer 2), and 100 g of THF as a solvent. The reactor was cooled to −70° C. in a nitrogen atmosphere, after which deaeration in vacuo and nitrogen blow were repeated three times. After warming to room temperature, 4.0 g of 2,2'-azobis(2,4-dimethylvalero-nitrile) as a polymerization initiator was added. The reactor was heated to 55° C., at which reaction was conducted for 25 hours. The reaction solution was diluted with 5 ml of acetone and poured into 4.5 liters of isopropyl alcohol for precipitation. The white solid precipitate was collected by filtration and dried in vacuo at 40° C., yielding 86 g of a white polymer.

The polymer was analyzed by $^{13}$C— and $^1$H-NMR and GPC, with the results shown below.

Copolymer compositional ratio maleic anhydride:Monomer 2=51:49

Mw=18,200

Molecular weight dispersity (Mw/Mn)=1.75

This is designated Polymer 2.

Synthesis Example 3

In a 300-ml flask were admitted 11.1 g of N-methylmaleimide, 105 g of 1-(dimethylvinylsilyloxy)-3,5,7,9,11,13,15-heptacyclopentylpentacyclo-[9.5.1.1$^{3.9}$.1$^{5.15}$.1$^{7.13}$]octasiloxane (Monomer 2), and 100 g of THF as a solvent. The reactor was cooled to −70° C. in a nitrogen atmosphere, after which deaeration in vacuo and nitrogen blow were repeated three times. After warming to room temperature, 4.0 g of 2,2'-azobis(2,4-dimethylvalero-nitrile) as a polymerization initiator was added. The reactor was heated to 55° C., at which reaction was conducted for 25 hours. The reaction solution was diluted with 5 ml of acetone and poured into 4.5 liters of isopropyl alcohol for precipitation. The white solid precipitate was collected by filtration and dried in vacuo at 40° C., yielding 89 g of a white polymer.

The polymer was analyzed by $^{13}$C— and $^1$H-NMR and GPC, with the results shown below.

Copolymer compositional ratio methylmaleimide:Monomer 2=48:52

Mw=17,500

Molecular weight dispersity (Mw/Mn)=1.75

This is designated Polymer 3.

Synthesis Example 4

In a 300-ml flask were admitted 7.8 g of fumaronitrile, 105 g of 1-(dimethylvinylsilyloxy)-3,5,7,9,11,13,15-heptacyclopentylpentacyclo[9.5.1.1$^{3.9}$. 1$^{5.15}$.1$^{7.13}$]octasiloxane (Monomer 2), and 100 g of THF as a solvent. The reactor was cooled to −70° C. in a nitrogen atmosphere, after which deaeration in vacuo and nitrogen blow were repeated three times. After warming to room temperature, 4.0 g of 2,2'-azobis(2,4-dimethylvaleronitrile) as a polymerization initiator was added. The reactor was heated to 55° C., at which reaction was conducted for 25 hours. The reaction solution was diluted with 5 ml of acetone and poured into 4.5 liters of isopropyl alcohol for precipitation. The white solid precipitate was collected by filtration and dried in vacuo at 40° C., yielding 87 g of a white polymer.

The polymer was analyzed by $^{13}$C— and $^1$H-NMR and GPC, with the results shown below.

Copolymer compositional ratio fumaronitrile:Monomer 2=55:45

Mw=16,800

Molecular weight dispersity (Mw/Mn)=1.72

This is designated Polymer 4.

Synthesis Example 5

In a 500-ml autoclave reactor were admitted 105 g of 1-(dimethylvinylsilyloxy)-3,5,7,9,11,13,15-heptacyclopentyl-pentacyclo[9.5.1.1$^{3.9}$.1$^{5.15}$.1$^{7.13}$]octasiloxane (Monomer 2) and 100 g of THF as a solvent. The reactor was cooled to −70° C. in a nitrogen atmosphere, after which deaeration in vacuo and nitrogen blow were repeated three times. After warming to room temperature, 130 g of tetrafluoroethylene gas was injected and 6.3 g of 2,2'-azobis(2,4-dimethylvaleronitrile) as a polymerization initiator was added. The reactor was heated to 55° C., at which reaction was conducted for 25 hours. After nitrogen purge, the reaction solution was poured into 4.5 liters of methanol for precipitation. The white solid precipitate was collected by filtration and dried in vacuo at 30° C., yielding 165 g of a white polymer.

The polymer was analyzed by $^{13}$C— and $^1$H-NMR and GPC, with the results shown below.

Copolymer compositional ratio tetrafluoroethylene:Monomer 2=57:43

Mw=21,050

Molecular weight dispersity (Mw/Mn)=1.56

This is designated Polymer 5.

Synthesis Example 6

In a 300-ml flask were admitted 19.6 g of maleic anhydride, 42 g of 1-(dimethylvinylsilyloxy)-3,5,7,9,11,13,15-heptacyclopentylpentacyclo-[9.5.1.1$^{3.9}$.1$^{5.15}$.1$^{7.13}$] octasiloxane (Monomer 2), 60 g of 1-(7-oxanorbornan-2-yl) cyclopentyl 5-norbornene-2-carboxylate (Monomer 3), and 100 g of THF as a solvent. The reactor was cooled to −70° C. in a nitrogen atmosphere, after which deaeration in vacuo and nitrogen blow were repeated three times. After warming to room temperature, 6.0 g of 2,2'-azobis(2,4-dimethylvaleronitrile) as a polymerization initiator was added. The reactor was heated to 55° C., at which reaction was conducted for 25 hours. The reaction solution was diluted with 15 ml of acetone and poured into 4.5 liters of isopropyl alcohol for precipitation. The white solid precipitate was collected by filtration and dried in vacuo at 40° C., yielding 86 g of a white polymer.

The polymer was analyzed by $^{13}$C— and $^1$H-NMR and GPC, with the results shown below.

Copolymer compositional ratio maleic anhydride:Monomer 2:Monomer 3=51:9:40

Mw=13,100

Molecular weight dispersity (Mw/Mn)=1.81

This is designated Polymer 6.

Synthesis Example 7

In a 300-ml flask were admitted 24.4 g of methyl vinyl-sulfonate (Monomer 4), 42 g of 1-(dimethylvinyl-silyloxy)-3,5,7,9,11,13,15-heptacyclopentylpentacyclo-[9.5.1.1$^{3.9}$.1$^{5.15}$.1$^{7.13}$]octasiloxane (Monomer 2), 49 g of methacrylic acid-2-ethyl-2-adamantyl, and 100 g of THF as a solvent. The reactor was cooled to −70° C. in a nitrogen atmosphere, after which deaeration in vacuo and nitrogen blow were repeated three times. After warming to room temperature, 6.0 g of 2,2'-azobis(2,4-dimethylvaleronitrile) as a polymerization initiator was added. The reactor was heated to 55° C., at which reaction was conducted for 25 hours. The reaction solution was diluted with 15 ml of acetone and poured into 4.5 liters of isopropyl alcohol for precipitation. The white solid precipitate was collected by filtration and dried in vacuo at 40° C., yielding 92 g of a white polymer.

The polymer was analyzed by $^{13}$C— and $^1$H-NMR and GPC, with the results shown below.

Copolymer compositional ratio methyl vinylsulfonate:Monomer 2:2-ethyl-2-adamantyl methacrylate=58:10:32

Mw=15,600

Molecular weight dispersity (Mw/Mn)=1.92
This is designated Polymer 7.

Synthesis Example 8

In a 300-ml flask were admitted 24.4 g of 5-(2-hydroxy-2,2-bistrifluoromethyl)ethyl-2-norbornene (Monomer 5), 42 g of 1-(dimethylvinylsilyloxy)-3,5,7,9,11,13,15-heptacyclopentylpentacyclo-[9.5.1.1$^{3,9}$. 1$^{5,15}$. 1$^{7,13}$] octasiloxane (Monomer 2), 42 g of 1-trifluoromethylacrylic acid-2-t-butyl (Monomer 6), and 100 g of THF as a solvent. The reactor was cooled to −70° C. in a nitrogen atmosphere, after which deaeration in vacuo and nitrogen blow were repeated three times. After warming to room temperature, 6.0 g of 2,2'-azobis(2,4-dimethylvaleronitrile) as a polymerization initiator was added. The reactor was heated to 55° C., at which reaction was conducted for 25 hours. The reaction solution was diluted with 15 ml of acetone and poured into 4.5 liters of isopropyl alcohol for precipitation. The white solid precipitate was collected by filtration and dried in vacuo at 40° C., yielding 78 g of a white polymer.

The polymer was analyzed by $^{13}$C— and $^{1}$H-NMR and GPC, with the results shown below.

Copolymer compositional ratio

Monomer 5:Monomer 2:Monomer 6=41:12:47
Mw=16,600
Molecular weight dispersity (Mw/Mn)=1.84
This is designated Polymer 8.

Monomer 1
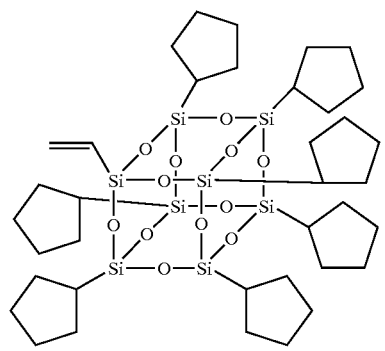

Monomer 2
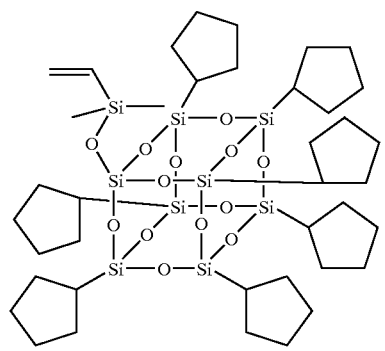

Monomer 3
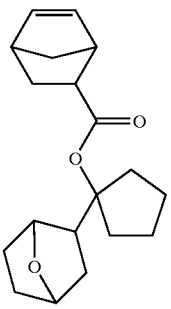

Monomer 4
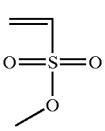

Monomer 5
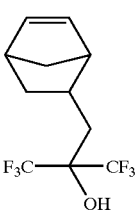

Monomer 6
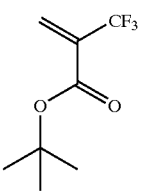

Dry Etching Test

A polymer solution was prepared by thoroughly dissolving 1 g of each of the polymers (Synthesis Examples 1 to 8) or 3 g of a novolak resin having a m/p ratio of 6/4 and Mw of 8,000 in 10 g of propylene glycol monomethyl ether acetate and passing the solution through a 0.2-micron filter. The polymer solution was spin coated to a silicon wafer and baked at 110° C. for 60 seconds to form a polymer film of 200 nm thick or a novolak film of 1,000 nm thick. The wafer having the polymer film formed thereon was subjected to dry etching under two sets of conditions. A difference in polymer film thickness before and after the etching test was determined.

(1) O$_2$ etching test:

Using a dry etching instrument TE-8500P by Tokyo Electron K.K., the polymer films were etched with oxygen gas under the following conditions.

| | |
|---|---|
| Chamber pressure | 450 mTorr |
| RF power | 600 W |
| Ar gas flow rate | 40 sccm |
| O$_2$ gas flow rate | 60 sccm |
| Gap | 9 mm |
| Time | 60 sec |

(2) Cl$_2$/BCl$_3$ Etching Test:

Using a dry etching instrument L-507D-L by Nichiden Anerba K.K., the polymer films were etched with halide gases under the following conditions.

| Chamber pressure | 300 mTorr |
| RF power | 300 W |
| Gap | 9 mm |
| Cl$_2$ gas flow rate | 30 sccm |
| BCl$_3$ gas flow rate | 30 sccm |
| CHF$_3$ gas flow rate | 100 sccm |
| O$_2$ gas flow rate | 2 sccm |
| Time | 60 sec |

The results are shown in Table 1.

TABLE 1

| Polymer | O$_2$ gas etching rate (nm/min) | Cl$_2$/BCl$_3$ gas etching rate (nm/min) |
|---|---|---|
| Polymer 1 | 110 | 152 |
| Polymer 2 | 122 | 135 |
| Polymer 3 | 121 | 144 |
| Polymer 4 | 119 | 139 |
| Polymer 5 | 299 | 250 |
| Polymer 6 | 228 | 260 |
| Polymer 7 | 230 | 252 |
| Polymer 8 | 380 | 330 |
| Novolak | 8000 | 303 |

Resist Evaluation

Resist solutions were prepared by thoroughly dissolving each of the silicone polymers (Polymers 6 to 8), photoacid generator (PAG1, PAG2) and dissolution inhibitor (DRI1, DRI2) in 1,000 parts by weight of propylene glycol monomethyl ether acetate (PGMEA) containing 0.01% by weight of surfactant FC-430 (Sumitomo 3M Ltd.) in the combination and amounts shown in Table 2, followed by filtration through a 0.2-micron Teflon® filter.

A novolak base resist material OFPR-800 (Tokyo Ouka Kogyo K.K.) was applied onto on a silicon wafer and heat cured at 300° C. for 5 minutes to form a lower layer of 0.5 µm thick. An antireflective material DUV-30 (Brewer Science) was spin coated onto the lower layer and baked at 100° C. for 30 seconds and then at 200° C. for 60 seconds, forming an antireflective film of 85 nm thick.

Each resist solution was spin coated onto the cured DUV-30/novolak resist and baked on a hot plate at 110° C. for 60 seconds to form a resist film of 200 nm thick. The resist film was exposed using an ArF excimer laser stepper S305B (Nikon Corporation; NA 0.68, σ 0.85, 2/3 annular illumination), then baked (PEB) at 110° C. for 60 seconds, and developed for 60 seconds with a 2.38 wt % aqueous solution of tetramethylammonium hydroxide (TMAH), thereby giving a positive pattern.

The resist pattern was evaluated as follows. The sensitivity of the resist is the optimum exposure (Eop) which provided a 0.15 µm line-and-space pattern in a ratio of 1:1. The resolution is defined as the minimum line width (µm) of the line-and-space pattern that separated at this exposure. The results are shown in Table 2.

TABLE 2

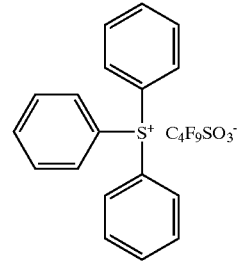

PAG1

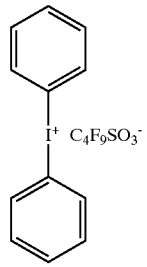

PAG2

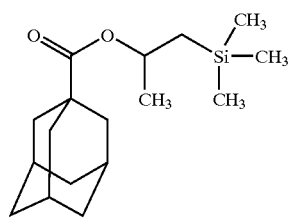

TABLE 2-continued

DRI1

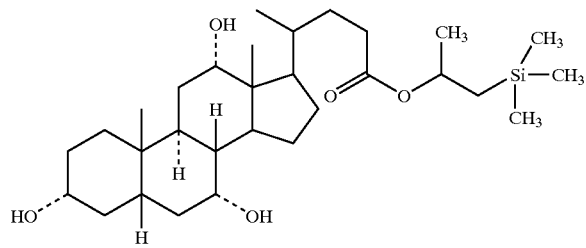

DRI2

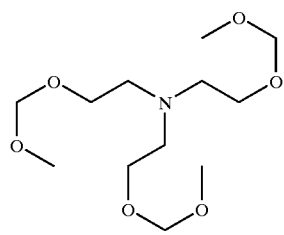

TMMEA

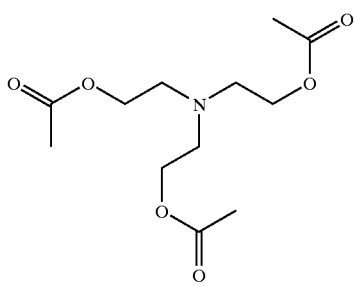

AAA

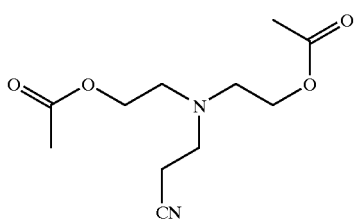

AACN

| Polymer (pbw) | Photoacid generator (pbw) | Basic compound (pbw) | Dissolution inhibitor (pbw) | Solvent (pbw) | Sensitivity (mJ/cm$^2$) | Resolution (μm) |
|---|---|---|---|---|---|---|
| Polymer 6 (100) | PAG1 (2) | tributylamine (0.1) | — | PGMEA (1,000) | 22 | 0.11 |
| Polymer 7 (100) | PAG1 (2) | tributylamine (0.1) | — | PGMEA (1.000) | 25 | 0.11 |
| Polymer 8 (100) | PAG1 (2) | tributylamine (0.1) | — | PGMEA (1,000) | 32 | 0.12 |
| Polymer 6 (100) | PAG2 (3.5) | tributylamine (0.1) | — | PGMEA (1,000) | 45 | 0.11 |
| Polymer 6 (100) | PAG1 (2) | TMMEA (0.2) | — | PGMEA (1,000) | 24 | 0.11 |
| Polymer 6 (100) | PAG1 (2) | AAA (0.2) | — | PGMEA (1,000) | 25 | 0.10 |
| Polymer 6 (100) | PAG1 (2) | AACN (0.2) | — | PGMEA (1,000) | 28 | 0.10 |

TABLE 2-continued

| Polymer 6 (100) | PAG1 (2) | tributylamine (0.1) | DRI1 (20) | PGMEA (1,000) | 20 | 0.11 |
| Polymer 6 (100) | PAG1 (2) | tributylamine (0.1) | DRI2 (20) | PGMEA (1,000) | 26 | 0.11 |

Polymer Transmittance Measurement

Each of Polymers 6 to 8, 1 g, was thoroughly dissolved in 20 g of propylene glycol monomethyl ether acetate (PGMEA), and passed through a 0.2-μm filter, obtaining a polymer solution. The polymer solution was spin coated onto a $MgF_2$ substrate and baked on a hot plate at 100° C. for 90 seconds, forming a polymer layer of 100 nm thick on the substrate. Using a vacuum ultraviolet spectrometer (VUV-200S by Nihon Bunko K.K.), the polymer layer was measured for transmittance at 248 nm, 193 nm and 157 nm. The results are shown in Table 3.

TABLE 3

| Polymer | Transmittance (%) | | |
| --- | --- | --- | --- |
|  | 248 nm | 193 nm | 157 nm |
| Polymer 6 | 93 | 85 | 35 |
| Polymer 7 | 92 | 86 | 48 |
| Polymer 8 | 92 | 93 | 58 |

Next, using Polymer 8 having a relatively high transmittance at 157 nm, a resist composition was prepared according to the formulation shown in Table 4. On a silicon wafer having a film of DUV-30 (Brewer Science) coated to a thickness of 85 nm, the resist solution was spin coated, then baked on a hot plate at 120° C. for 90 seconds to give a resist film having a thickness of 100 nm. The resist film was exposed by means of an $F_2$ laser VUVES 4500 (Lithotec Japan Co., Ltd.) while varying the exposure dose. Immediately after exposure, the resist films were baked at 120° C. for 90 seconds and then developed for 60 seconds with a 2.38% aqueous solution of tetramethylammonium hydroxide. The film thickness was measured in different dose areas. From the residual film thickness-to-dose relationship, the sensitivity (Eth) giving a film thickness 0 was determined. A γ value which was the slope (tan θ) of the characteristic curve was also determined. The results are shown in Table 4.

TABLE 4

| Polymer (pbw) | Photoacid generator (pbw) | Basic compound (pbw) | Dissolution inhibitor (pbw) | Solvent (pbw) | Eth (mJ/cm²) | γ |
| --- | --- | --- | --- | --- | --- | --- |
| Polymer 8 (100) | PAG1 (4) | tributylamine (0.15) | — | PGMEA (1300) | 11 | 13.5 |

It is seen that the resist compositions comprising silicon-containing polymers of the invention exhibit a high resolution when processed by ArF excimer laser lithography, a high dissolution contrast upon $F_2$ laser exposure, a higher selectivity ratio than the underlying novolak when etched with oxygen gas, and a high resistance to chlorine gas etching comparable to novolak.

Japanese Patent Application No. 2003-148656 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A silicon-containing polymer comprising recurring units of the general formula (1) and units which improve alkali solubility under the action of an acid,

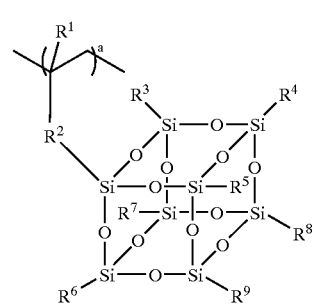

(1)

wherein $R^1$ is hydrogen or a straight, branched or cyclic $C_1$–$C_{10}$ alkyl group, $R^2$ is a single bond or a divalent linking group of the general formula (2):

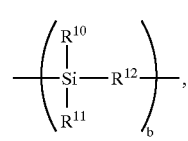

(2)

$R^3$ to $R^9$ are each independently hydrogen or a straight, branched or cyclic $C_1$–$C_{12}$ alkyl or fluoroalkyl group which may contain an ether, lactone, ester, hydroxy or cyano group, $R^{10}$ and $R^{11}$ are each independently a straight, branched or cyclic $C_1$–$C_{10}$ alkyl group, $R^{12}$ is a single bond, oxygen atom or $C_1$–$C_4$ alkylene group, a is a positive number, and b is an integer of 1 to 20.

2. The polymer of claim 1, further comprising recurring units containing an acid labile group selected from the general formulae (d1) to (d7):

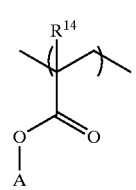

(d1)

-continued (d2)
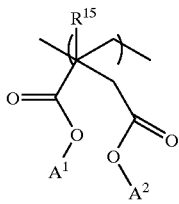

(d3)
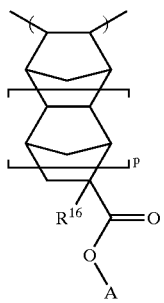

(d4)
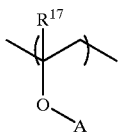

(d5)
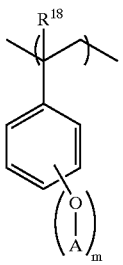

(d6)
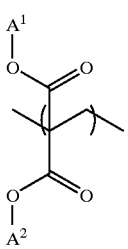

(d7)
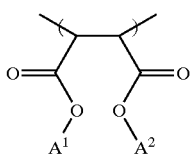

wherein $R^{14}$ to $R^{18}$ are each independently hydrogen, a $C_1$–$C_{20}$ alkyl group, $C_6$–$C_{20}$ aryl group, $C_1$–$C_{20}$ haloalkyl group or cyano group, A is an acid labile group, p is 0 or 1, m is 1 or 2, both or either one of $A^1$ and $A^2$ is an acid labile group, and one of $A^1$ and $A^2$ is hydrogen, a $C_1$–$C_{20}$ alkyl group or adhesive group when it is not an acid labile group.

3. A resist composition comprising the polymer of claim 1.

4. A process for forming a resist pattern comprising the steps of:

applying the resist composition of claim 3 onto a substrate to form a coating, heat treating the coating and then exposing it to high-energy radiation having a wavelength of up to 300 nm or electron beam through a photomask, and optionally heat treating the exposed coating and developing it with a developer.

5. The pattern forming process of claim 4 wherein the substrate bears thereon an underlay on which the coating of the resist composition is formed, said process further comprising the step of treating the underlay by oxygen plasma etching, after the resist pattern formation.

6. The pattern forming process of claim 4 wherein the substrate bears thereon an underlay on which the coating of the resist composition is formed, said process further comprising the step of treating the underlay by etching with a halogen gas containing chlorine or bromine, after the resist pattern formation.

7. A chemically amplified, positive resist composition comprising (I) the polymer of claim 1 as a base resin, (II) a photoacid generator, and (III) an organic solvent.

8. The resist composition of claim 7, further comprising a basic compound.

9. A chemically amplified, positive resist composition comprising (I) the polymer of claim 1 as a base resin, (II) a photoacid generator, (III) an organic solvent, and (IV) a dissolution inhibitor.

10. A silicon-containing polymer comprising recurring units of the general formula (3):

(3)
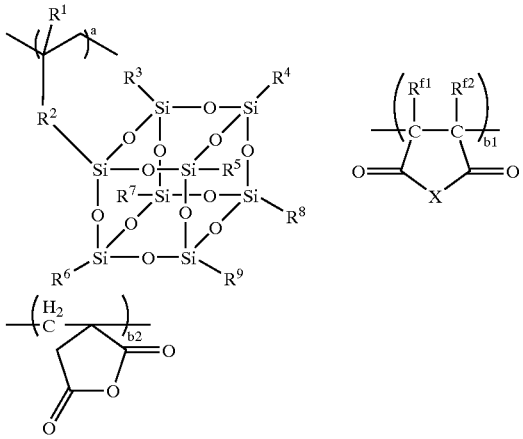

wherein $R^1$ is hydrogen or a straight, branched or cyclic $C_1$–$C_{10}$ alkyl group, $R^2$ is a single bond or a divalent linking group of the general formula (2):

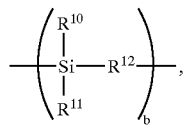

R³ to R⁹ are each independently hydrogen or a straight, branched or cyclic $C_1$–$C_{12}$ alkyl or fluoroalkyl group which may contain an ether, lactone, ester, hydroxy or cyano group, $R^{10}$ and $R^{11}$ are each independently a straight, branched or cyclic $C_1$–$C_{10}$ alkyl group, $R^{12}$ is a single bond, oxygen atom or $C_1$–$C_4$ alkylene group, a is a positive number, b is an integer of 1 to 20, X is an oxygen atom, sulfur atom or —$NR^{13}$—, $R^{13}$ is hydrogen, a hydroxy group or a straight, branched or cyclic $C_1$–$C_{10}$ alkyl group, and may contain an acid labile group-substituted alkoxycarbonyl group, $R^{f1}$ and $R^{f2}$ each are hydrogen, fluorine or trifluoromethyl, b1 and b2 are 0 or positive numbers, and the sum of b1+b2 is a positive number.

11. A silicon-containing polymer comprising recurring units of the general formula (4):

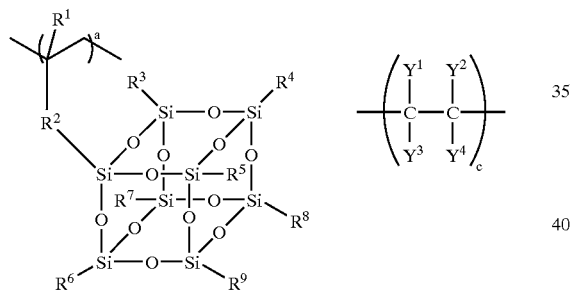

wherein $R^1$ is hydrogen or a straight, branched or cyclic $C_1$–$C_{10}$ alkyl group, $R^2$ is a single bond or a divalent linking group of the general formula (2):

R³ to R⁹ are each independently hydrogen or a straight, branched or cyclic $C_1$–$C_{12}$ alkyl or fluoroalkyl group which may contain an ether, lactone, ester, hydroxy or cyano group, $R^{10}$ and $R^{11}$ are each independently a straight, branched or cyclic $C_1$–$C_{10}$ alkyl group, $R^{12}$ is a single bond, oxygen atom or $C_1$–$C_4$ alkylene group, a is a positive number, b is an integer of 1 to 20, $Y^1$, $Y^2$, $Y^3$ and $Y^4$ are each independently a hydrogen atom, fluorine atom, chlorine atom, bromine atom, cyano group, alkoxycarbonyl group, fluoroalkyl group, alkoxy group, hydroxy group, acetyl group, sulfonic acid ester or sulfone, with the proviso that all of $Y^1$ to $Y^4$ are not hydrogen at the same time, and c is a positive number.

* * * * *